United States Patent
Huang et al.

(10) Patent No.: US 12,301,265 B2
(45) Date of Patent: May 13, 2025

(54) RADIO-FREQUENCY CHIP

(71) Applicant: Huawei Technologies Co., Ltd., Shenzhen (CN)

(72) Inventors: Yong Huang, Shanghai (CN); Keji Cui, Shenzhen (CN); Lei Lu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 328 days.

(21) Appl. No.: 18/070,096

(22) Filed: Nov. 28, 2022

(65) Prior Publication Data

US 2023/0090113 A1    Mar. 23, 2023

Related U.S. Application Data

(63) Continuation of application No. PCT/CN2020/093541, filed on May 29, 2020.

(51) Int. Cl.
  *H04B 1/00*    (2006.01)
  *H04B 1/712*    (2011.01)

(52) U.S. Cl.
  CPC .............. *H04B 1/006* (2013.01); *H04B 1/712* (2013.01)

(58) Field of Classification Search
  CPC ...... H04B 1/006; H04B 1/712; H04B 7/0617; H01Q 3/38; H03H 7/20; H03H 7/21
  USPC .................................................. 455/552.1
  See application file for complete search history.

(56) References Cited

U.S. PATENT DOCUMENTS

| | | | |
|---|---|---|---|
| 2009/0251368 A1* | 10/2009 | McCune, Jr. ........... | H01Q 3/267 342/368 |
| 2020/0335866 A1* | 10/2020 | Wang ...................... | H01Q 3/28 |
| 2020/0395662 A1* | 12/2020 | Tervo ...................... | H01Q 3/267 |

FOREIGN PATENT DOCUMENTS

| | | | | |
|---|---|---|---|---|
| CN | 110534870 A | * | 12/2019 | ............... H01Q 1/22 |
| WO | WO-2016199290 A1 | * | 12/2016 | ............... H01Q 3/38 |
| WO | WO-2021170204 A1 | * | 9/2021 | |

* cited by examiner

*Primary Examiner* — Tanmay K Shah
(74) *Attorney, Agent, or Firm* — SLATER MATSIL, LLP

(57) ABSTRACT

A radio-frequency chip is provided, and relates to the field of chip technologies, to reduce a component loss caused by redundant components in the radio-frequency chip. The radio-frequency chip includes a phased array, the phased array includes a plurality of branches, and each of the plurality of branches includes a transmitting path, a receiving path, a common path, and a phase shifter. The phase shifter includes a first phase shift unit, a second phase shift unit, and a third phase shift unit. The first phase shift unit is located on the transmitting path, the second phase shift unit is located on the receiving path, and the third phase shift unit is located on the common path.

20 Claims, 16 Drawing Sheets

(a)    (b)

RADIO-FREQUENCY CHIP

CROSS-REFERENCE TO RELATED APPLICATIONS

This application is a continuation of International Application No. PCT/CN2020/093541, filed on May 29, 2020, the disclosure of which is hereby incorporated by reference in its entirety.

TECHNICAL FIELD

This application relates to the field of chip technologies, and in particular, to a radio-frequency chip.

BACKGROUND

Currently, high-frequency communication in a 5th generation mobile communications (5G) network can cover a millimeter-wave frequency band. Extensive research has been performed on the millimeter wave frequency band due to rich spectrum resources of the millimeter wave, but a high path loss of the millimeter wave hinders development of the millimeter wave. A phased array beamforming technology provides a solution. In the technology, a phase shifter (PS) is an important module. For a radio frequency phase shifter array, the phase shifter is located in a phased array radio frequency front end transceiver (TR) assembly. The radio frequency front end may be located in a radio-frequency chip and used to receive and send data.

FIG. 1 is a schematic diagram of a common phased array radio frequency front end TR assembly and an antenna. The TR assembly includes a receiving path and a transmitting path. The receiving path includes a low noise amplifier (LNA) and a phase shifter (PS). The transmitting path includes a power amplifier (PA) and a PS. A single pole double throw (SPDT) switch may be used on the receiving path and the transmitting path to implement TR switching. However, because two PSs and one single pole double throw switch are used in a structure of the TR assembly, a component loss of the radio-frequency chip is relatively large.

SUMMARY

Embodiments of this application provide a radio-frequency chip to reduce a component loss caused by redundant components in the radio-frequency chip.

To achieve the foregoing objective, the following technical solutions are used in embodiments of this application.

According to a first aspect, a radio-frequency chip is provided. The radio-frequency chip includes a phased array. The phased array includes a plurality of branches. Each of the plurality of branches includes a transmitting path, a receiving path, a common path, and a phase shifter. The phase shifter includes a first phase shift unit, a second phase shift unit, and a third phase shift unit. The first phase shift unit is located on the transmitting path. The second phase shift unit is located on the receiving path of the branch. The third phase shift unit is located on the common path. The phase shifter has a control interface, and the control interface is configured to provide a corresponding phase shift control signal and a corresponding turn-off control signal for the first phase shift unit and the second phase shift unit respectively. It may also be understood that the control interface is configured to receive a control signal and then forward the control signal to the first phase shift unit and the second phase shift unit. The control signal may be a phase shift control signal or a turn-off control signal. The first phase shift unit is configured to provide, based on the control signal, a phase shift or turn-off operation for a signal transmitted on the transmitting path. The second phase shift unit is configured to provide, based on the control signal, a phase shift or turn-off operation for a signal transmitted on the receiving path.

Because the first phase shift unit of the phase shifter is located on the transmitting path and the second phase shift unit is located on the receiving path, it can be learned that, in this application, some phase shift units of the phase shifter are placed on the transmitting path and the receiving path. The phase shift unit on the transmitting path and the phase shift unit on the receiving path may have both a phase shift function and a switch function. In this way, when TR switching is implemented, additional switches introduced can be reduced, an insertion loss is reduced, and a path loss is reduced.

In a possible design, a phase shift resolution of the first phase shift unit is the same as a phase shift resolution of the second phase shift unit, and the phase shift resolution of the first phase shift unit is different from a phase shift resolution of the third phase shift unit. It may be understood that digital control bits corresponding to the first phase shift unit and the second phase shift unit are the same, and digital control bits corresponding to the first phase shift unit and the third phase shift unit are different, and phase shift units corresponding to different digital control bits have different phase shift resolutions. For example, the phase shift resolution corresponding to the first phase shift unit is 180°, and the phase shift resolution corresponding to the third phase shift unit is 90°. In this way, whether a corresponding phase shift unit implements a phase shift can be controlled by using a digital control bit, to obtain different phase shifts.

In a possible design, the phase shifter is a digital phase shifter, and the phase shift control signal includes a plurality of digital control bits, where a digital control bit corresponding to the first phase shift unit is higher than a digital control bit corresponding to the third phase shift unit. For example, if digital control bits corresponding to the phase shifter are 10, a phase shift unit corresponding to a bit "1" is the first phase shift unit, and a phase shift unit corresponding to a bit "0" is the third phase shift unit.

In a possible design, a digital control bit corresponding to the first phase shift unit is the same as a digital control bit corresponding to the second phase shift unit. For example, if digital control bits corresponding to the phase shifter are AB, phase shift units corresponding to a bit "A" are the first phase shift unit and the second phase shift unit.

In a possible design, the first phase shift unit, the second phase shift unit, and the third phase shift unit are jointly connected to a same node; and when the branch of the phased array is configured to transmit signals, the transmitted signals phase-shifted by the first phase shift unit enter the third phase shift unit through the same node, that is, the first phase shift unit and the third phase shift unit are configured to perform phase shifts on the transmitting path, and the phase shifts of the transmitting path include a phase shift of the first phase shift unit and a phase shift of the third phase shift unit; or when the branch of the phased array is configured to receive signals, the received signals phase-shifted by the third phase shift unit enter the second phase shift unit through the same node, that is, the second phase shift unit and the third phase shift unit are configured to perform phase shifts on the receiving path, and the phase shifts of the receiving path include a phase shift resolution of the second phase shift unit and a phase shift resolution of the third phase shift unit.

In a possible design, the first phase shift unit has a differential signal structure, the first phase shift unit includes a differential input end and a differential output end, the differential input end includes a first input end and a second input end, and the differential output end includes a first output end and a second output end; and a first switch is coupled between the first input end and the first output end, a second switch is coupled between the second input end and the second output end, a third switch is coupled between the first input end and the second output end, and a fourth switch is coupled between the second input end and the first output end. The phase shift control signal is used to provide mutually inverting control signals for a first group of switches and a second group of switches, and the turn-off control signal is used to provide mutually non-inverting control signals for the first group of switches and the second group of switches. The first group of switches includes the first switch and the second switch. The second group of switches includes the third switch and the fourth switch.

It may be understood that the first phase shift unit includes two groups of crossbars. If control words of the first switch and the second switch of the first phase shift unit are denoted as Vctrl, and control words of the third switch and the fourth switch are denoted as Vctrl_m, when Vctrl and Vctrl_m are mutually inverting control signals (for example, Vctrl=0 and Vctrl_m=1, or Vctrl=1 and Vctrl_m=0), the first phase shift unit works normally, and a 180° phase shift can be implemented by turning on the first group of switches (the first switch and the second switch) and the second group of switches (the third switch and the fourth switch) alternately. When the two groups of switches of the first phase shift unit are both turned off, that is, when Vctrl=0 and Vctrl_m=0, the first phase shift unit is turned off. In this case, the first phase shift unit may provide a high off-state impedance to implement an isolation function. A differential signal structure of the second phase shift unit may be the same as that of the first phase shift unit. When the first phase shift unit performs a phase shift and the second phase shift unit is turned off, or when the first phase shift unit is turned off and the second phase shift unit performs a phase shift, TR switching can be implemented.

In a possible design, the first phase shift unit includes an input end and an output end, a first switch and a second switch are coupled between the input end and the output end, the phase shift control signal is used to provide mutually inverting control signals for the first switch and the second switch, and the turn-off control signal is used to provide non-inverting control signals for the first switch and the second switch.

In the foregoing example, a control word of the first switch is denoted as Vctrl, and a control word of the second switch is denoted as Vctrl_m. When Vctrl=0 and Vctrl_m=1, or Vctrl=1 and Vctrl_m=0, the control signals of the first switch and the second switch are mutually inverting control signals. In this case, the first switch and the second switch provide a phase shift function. When Vctrl=0 and Vctrl_m=0, the control signals of the first switch and the second switch are non-inverting control signals. In this case, the first switch and the second switch provide a high off-state impedance.

In a possible design, when the first phase shift unit and the third phase shift unit are configured to perform phase shifts and the second phase shift unit is turned off, the transmitting path works, and the receiving path is disconnected; or when the second phase shift unit and the third phase shift unit are configured to perform phase shifts and the first phase shift unit is turned off, the transmitting path is disconnected, and the receiving path works.

In other words, when the first phase shift unit performs a phase shift, the second phase shift unit is turned off, and when the second phase shift unit performs a phase shift, the first phase shift unit is turned off. Therefore, in this application, a switch function of the first phase shift unit on the transmitting path can be reused, and a switch function of the second phase shift unit on the receiving path can be reused, so that an insertion loss of a switch component can be reduced.

In a possible design, the first phase shift unit includes a first group of switches and a second group of switches, the first group of switches includes a first switch and a second switch, and the second group of switches includes a third switch and a fourth switch; and when a gate voltage of the first group of switches and a gate voltage of the second group of switches are mutually reverse voltages, the first phase shift unit is configured to perform a phase shift; or when a gate voltage of the first group of switches and a gate voltage of the second group of switches are both low potentials or high potentials, the first phase shift unit is turned off.

Each switch in the first group of switches and the second group of switches may be a MOS transistor. The first group of switches and the second group of switches may be switches in a phase shift network with a differential signal structure, or may be switches in a phase shift network with a single-end input and a single-end output. For example, the first group of switches and the second group of switches may have differential signal structures. If a control word of the first group of switches in the first phase shift unit is denoted as Vctrl and a control word of the second group of switches is denoted as Vctrl_m, when Vctrl=0 and Vctrl_m=1, or Vctrl=1 and Vctrl_m=0, the first phase shift unit works normally, and a 180° phase shift can be implemented by turning on the first group of switches and the second group of switches alternately. When the two groups of switches are both turned off, that is, when Vctrl=0 and Vctrl_m=0, the first phase shift unit is turned off. In this case, the first phase shift unit may provide a high off-state impedance to implement an isolation function. Therefore, a differential signal structure of the second phase shift unit may be the same as that of the first phase shift unit. When the first phase shift unit performs a phase shift and the second phase shift unit is turned off, or when the first phase shift unit is turned off and the second phase shift unit performs a phase shift, TR switching can be implemented.

In a possible design, the first phase shift unit has a single-end input and single-end output structure; the first phase shift unit includes a third path and a fourth path, a first group of switches is on the third path, a second group of switches is on the fourth path, and the third path and the fourth path are connected in parallel; the third path further includes a T-type high-pass circuit connected in series to the first group of switches, and the T-type high-pass circuit includes a capacitor and an inductor; and the fourth path further includes a π-type low-pass circuit connected in series to the second group of switches, and the π-type low-pass circuit includes a capacitor and an inductor.

If a control word of a switch in the T-type high-pass circuit is denoted as Vctrl and a control word of a switch in the π-type low-pass circuit is denoted as Vctrl_m, when Vctrl=0 and Vctrl_m=1, or Vctrl=1 and Vctrl_m=0, the T-type high-pass circuit and the π-type low-pass circuit can generate a ±90° relative phase shift respectively, thereby implementing a 180° phase shift. When control signals of Vctrl and Vctrl_m are both 0, the first phase shift unit with the single-end input and single-end output structure may implement a switch function.

In a possible design, a bulk of at least one switch of the first phase shift unit is coupled to a bias voltage module, the bias voltage module is configured to provide a bias voltage for the bulk of the switch, and the bias voltage is used to increase an off-state impedance of the switch. For example, the bias voltage is high. The bulk may be coupled to the bias voltage module by using a resistor, or may be coupled to the bias voltage module by using a diode. There may be one or more bias voltage modules.

In a possible design, the bias voltage module is further configured to provide a bias voltage for a source and drain of the at least one switch.

For example, a high voltage provided by the bias voltage module is 0.5 V. In this way, during a phase shift, a gate voltage of the at least one switch is boosted. Assuming that a standard voltage of the switch is 0.9 V, because there is a 0.5 V bias voltage for each of the source voltage, the drain voltage, and the bulk voltage of the switch, the bias voltage is further superposed on the gate of the switch when the switch is turned on, that is, when the switch is turned on, the gate voltage is boosted by 0.5 V to 1.4 V on a basis of the 0.9 V standard voltage. However, because the gate voltage and source voltage of the switch are both boosted by the same voltage value, a potential difference between the gate and the source of the switch remains unchanged before and after the voltage boost. Therefore, on-state performance of the at least one switch whose voltage is boosted remains the same as on-state performance before the voltage boost. When the at least one switch is turned off, the gate voltage of the at least one switch is 0, and the source voltage, drain voltage, and bulk voltage continue to be boosted. In this case, the potential difference between the gate and the source of the at least one switch is less than the potential difference between the gate and the source of the at least one switch before the voltage boost. Therefore, an off-state impedance of the at least one switch is greater than an off-state impedance of the at least one switch before the voltage boost, that is, a voltage boost technology allows each switch to obtain a higher off-state impedance, so that the switch is turned off more completely.

In a possible design, the source and the drain of the at least one switch of the first phase shift unit are respectively coupled to a bias voltage module by using a resistor, where the bias voltage module is configured to provide a high voltage; and the bulk of the at least one switch of the first phase shift unit is coupled to an adjustable bias voltage module by using a resistor, where the adjustable bias voltage module is configured to provide an optional high level or low level. It may also be understood that the bias voltage of the bulk is adjustable. The bias voltage of the bulk may be adjusted based on an on state and an off state of the switch.

For example, when the switch is turned on, the source voltage, drain voltage, and bulk voltage of the switch are all boosted by 0.5 V, and the corresponding gate voltage is also boosted by 0.5 V to 1.4 V on a basis of a 0.9 V standard voltage. When the switch is turned off, the source voltage and the drain voltage are unchanged and are still 0.5 V, the gate voltage is 0 V, and the bulk voltage is changed from 0.5 V to 0 V. In this case, a potential difference Vbs between the source and the bulk of the switch is −0.5 V. In this case, a threshold voltage Vth of the switch increases due to a back gate effect. When the switch is turned off and a potential difference Vgs between the gate and the source is fixed, an increase of the threshold voltage Vth may further enable the switch to obtain a higher off-state impedance, so that the switch is turned off more completely.

According to a second aspect, a phase shift method is provided. The method is applied to a radio-frequency chip. The radio-frequency chip includes a phased array. The phased array includes a plurality of branches. Each of the plurality of branches includes a transmitting path, a receiving path, a common path, and a phase shifter. The phase shifter includes a first phase shift unit, a second phase shift unit, and a third phase shift unit. The first phase shift unit is located on the transmitting path. The second phase shift unit is located on the receiving path. The third phase shift unit is located on the common path. The phase shifter has a control interface, and the control interface is configured to provide a corresponding phase shift control signal and a corresponding turn-off control signal for the first phase shift unit and the second phase shift unit respectively. The method includes: providing the phase shift control signal for the first phase shift unit, to trigger the first phase shift unit to provide a phase shift for a signal transmitted on the transmitting path, and providing the turn-off control signal for the second phase shift unit, to trigger the second phase shift unit to provide a turn-off operation for a signal transmitted on the receiving path; or providing the turn-off control signal for the first phase shift unit, to trigger the first phase shift unit to provide a turn-off operation for a signal transmitted on the transmitting path, and providing the phase shift control signal for the second phase shift unit, to trigger the second phase shift unit to provide a phase shift for a signal transmitted on the receiving path.

For beneficial effects of the phase shift method in the second aspect, refer to the first aspect.

In a possible design, a phase shift resolution of the first phase shift unit is the same as a phase shift resolution of the second phase shift unit, and the phase shift resolution corresponding to the first phase shift unit is different from a phase shift resolution corresponding to the third phase shift unit.

In a possible design, the phase shifter is a digital phase shifter, and the phase shift control signal includes a plurality of digital control bits, where a digital control bit corresponding to the first phase shift unit is higher than a digital control bit corresponding to the third phase shift unit.

In a possible design, the first phase shift unit, the second phase shift unit, and the third phase shift unit are jointly connected to a same node; and the method further includes: when controlling the branch of the phased array to transmit signals, triggering the transmitted signals phase-shifted by the first phase shift unit to enter the third phase shift unit through the same node; or when controlling the branch of the phased array to receive signals, triggering the received signals phase-shifted by the third phase shift unit to enter the second phase shift unit through the same node.

In a possible design, the first phase shift unit has a differential signal structure, the first phase shift unit includes a differential input end and a differential output end, the differential input end includes a first input end and a second input end, and the differential output end includes a first output end and a second output end; and a first switch is coupled between the first input end and the first output end, a second switch is coupled between the second input end and the second output end, a third switch is coupled between the first input end and the second output end, and a fourth switch is coupled between the second input end and the first output end. The phase shift control signal is used to provide mutually inverting control signals for a first group of switches and a second group of switches, and the turn-off control signal is used to provide mutually non-inverting control signals for the first group of switches and the second group of switches. The first group of switches includes the first switch and the second switch. The second group of switches includes the third switch and the fourth switch.

In a possible design, the first phase shift unit includes an input end and an output end, a first switch and a second switch are coupled between the input end and the output end, the phase shift control signal is used to provide mutually inverting control signals for the first switch and the second switch, and the turn-off control signal is used to provide non-inverting control signals for the first switch and the second switch.

In a possible design, when the first phase shift unit and the third phase shift unit are configured to perform phase shifts and the second phase shift unit is turned off, the transmitting path works, and the receiving path is disconnected; or when the second phase shift unit and the third phase shift unit are configured to perform phase shifts and the first phase shift unit is turned off, the transmitting path is disconnected, and the receiving path works.

In a possible design, a bulk of at least one switch of the first phase shift unit is coupled to a bias voltage module, where the bias voltage module is configured to provide a high level. The method further includes: controlling the bias voltage module to provide a bias voltage for the bulk of the switch, where the bias voltage is used to increase an off-state impedance of the switch.

In a possible design, the method further includes: controlling the bias voltage module to provide a bias voltage for a source and drain of the at least one switch.

According to a third aspect, an electronic device is provided. The electronic device includes a transceiver, a memory, and a processor, where the transceiver includes the radio-frequency chip according to any one of the first aspect and/or the possible designs of the first aspect, and/or any one of the second aspect and/or the possible designs of the second aspect.

DETAILED DESCRIPTION OF ILLUSTRATIVE EMBODIMENTS

The following describes technical solutions in embodiments of this application with reference to the accompanying drawings in embodiments of this application. In the description of embodiments of this application, "/" means "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists. In addition, in the description in embodiments of this application, "a plurality of" means two or more.

The terms "first" and "second" mentioned below are merely intended for a purpose of description, and shall not be understood as an indication or implication of relative importance or implicit indication of a quantity of indicated technical features. Therefore, a feature limited by "first" or "second" may explicitly indicate or implicitly include one or more such features. In the description of the embodiments, unless otherwise stated, "a plurality of" means two or more than two.

Embodiments of this application may be applied to a phased array beamforming technology.

Figure 2:
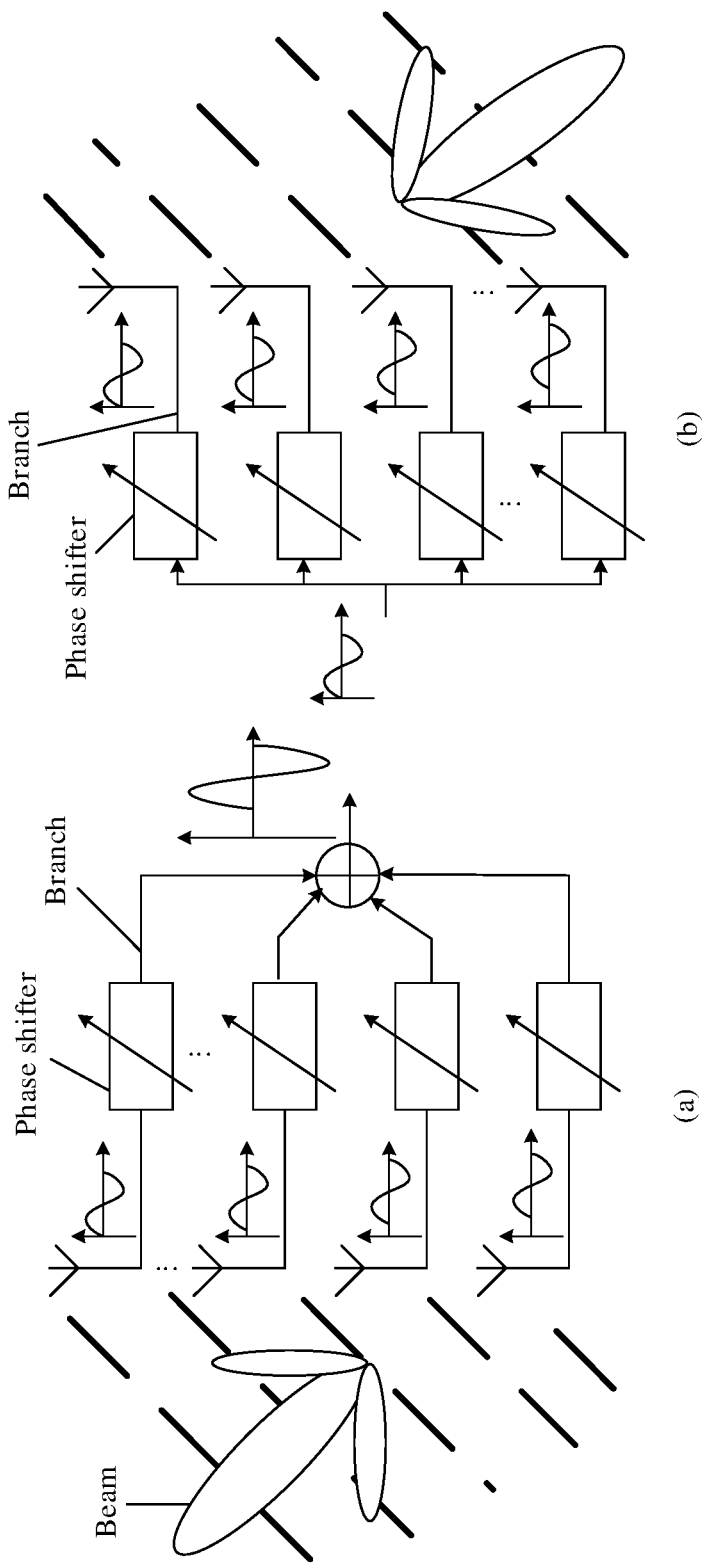
FIG. 2 is a schematic diagram of a structure of a radio-frequency chip according to an embodiment of this application.

This technology may be applied to a radio-frequency chip. The radio-frequency chip may be used for reception and transmission. As shown in FIG. 2, the radio-frequency chip is connected to an antenna. The radio-frequency chip may include a receiver and a transmitter of a phased array. An example of a receiver is shown in (a) in FIG. 2, and an example of a transmitter is shown in (b) in FIG. 2. Both the receiver and the transmitter include a plurality of branches, and each branch includes a phase shifter. When the receiver receives beams in different directions by using the antenna, a plurality of phase shifters in the receiver may be used to perform phase shifts on beam signals of different phases that are received by the corresponding antenna, to obtain beam signals in a specific direction. When the transmitter transmits beams in different directions by using the antenna, a plurality of phase shifters in the transmitter may be used to perform different phase shifts on signals of one phase to obtain beam signals in a specific direction.

Figure 3:
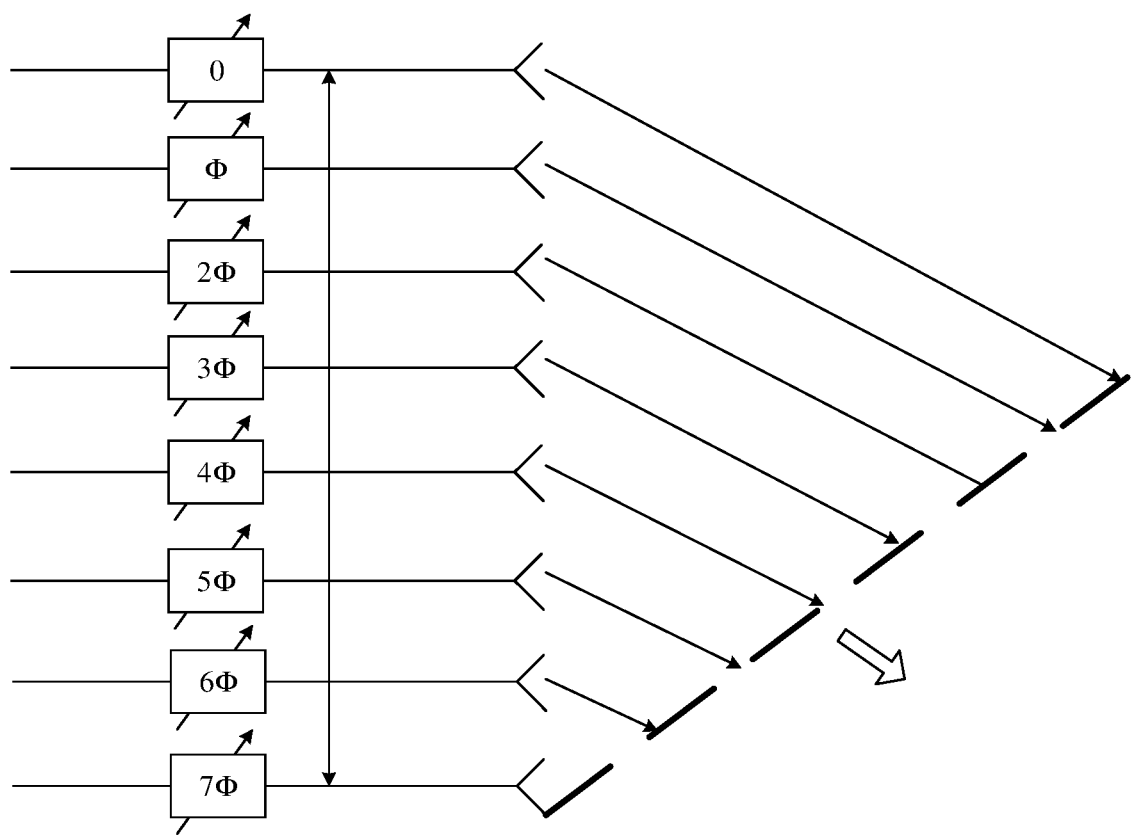
FIG. 3 is a schematic diagram of a phased array architecture according to an embodiment of this application.

It may be understood that the phased array can implement phase scanning. Because a phased array system requires a relatively large scanning angle, there are certain requirements on a phase shift resolution and a phase shift range of the phase shifter on each branch. To facilitate system control, the phased array usually uses a digital phase shifter technology. Digital control bits on each branch need to be changed to adjust a phase of the branch within the phase shift range accomplished by n bits, to implement phase scanning. Referring to FIG. 3, a phased array architecture shown in FIG. 3 includes eight branches. To implement full range coverage, a 3-bit digital phase shifter needs to be implemented on each branch, that is, a phase range accomplished by the eight branches is 0-7 Φ. The eight branches correspond to a phase shift range of the digital control bits 000-111. Different bits have different phase shift resolutions. Using 3 bits as an example, a phase shift resolution corresponding to a lowest bit is 2° Φ=Φ, a phase shift resolution corresponding to a middle bit is $2^1$ Φ=2 Φ, and a phase shift resolution corresponding to a highest bit is $2^2$ Φ=4 Φ.

Usually, 0-7 Φ can accomplish a phase shift range of 360°, and a minimum phase shift resolution of each branch is 45°. To achieve higher phase scanning precision, more bits can be added. For example, alternatively, the digital phase shifter may be a 4-bit digital phase shifter, and the minimum phase shift resolution Φ of each branch may be 22.5°.

Figure 4:
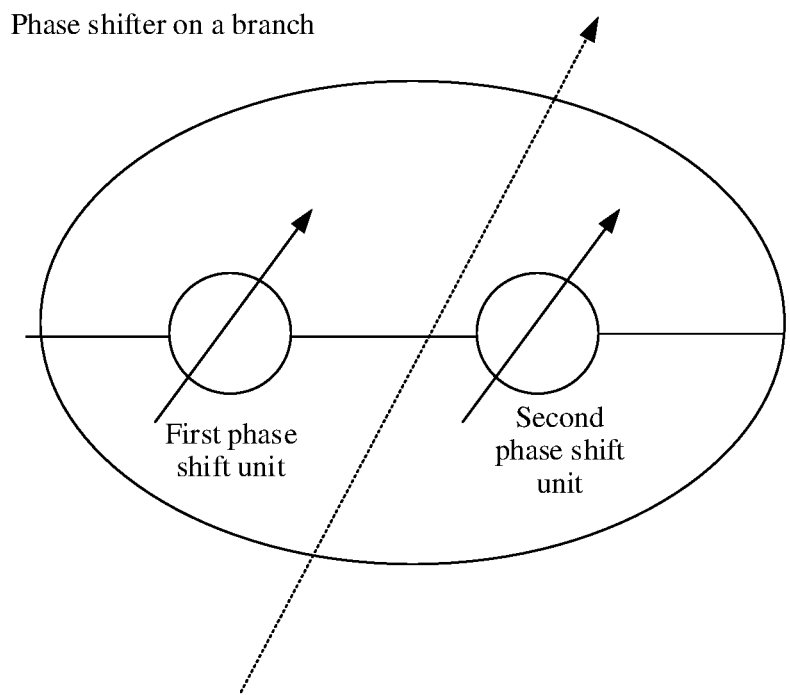
FIG. 4 is a schematic diagram of a structure of a phase shifter on a branch according to an embodiment of this application.

For each branch, to accomplish the phase shift range of the n bits and a phase shift resolution of a single bit, the phase shifter on each branch is usually implemented by connecting a plurality of phase shift units in series. As shown in FIG. 4, a phase shifter on one branch may include one or more phase shift units connected in series, and FIG. 4 shows a first phase shift unit and a second phase shift unit connected in series. A phase shift resolution of the first phase shift unit is different from a phase shift resolution of the second phase shift unit. The first phase shift unit and the second phase shift unit correspond to different digital control bits, and a combination of n phase shift units can accomplish a phase shift range of the n-bit digital phase shifter.

Figure 5:
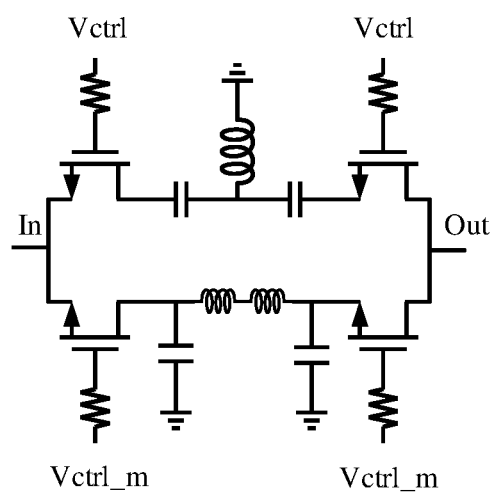
FIG. 5 is a schematic diagram of a structure of a single-end 180° phase shift unit using a high-pass/low-pass phase shift network according to an embodiment of this application.

Usually, a phase shift unit of a high bit in the n bits may be implemented by using a high-pass/low-pass (HP/LP) phase shift network. FIG. 5 shows an example of a single-end 180° phase shift unit using a high-pass/low-pass phase shift network. This structure using the high-pass/low-pass phase shift network is applicable to generation of a large-angle phase shift. Changing a control word (for example, changing 0 to 1) corresponding to a digital control bit of the high-pass/low-pass phase shift network may enable signals to pass through a high-pass signal branch and a low-pass signal branch respectively. An output signal of the high-pass signal branch may have a phase advance in comparison with an input signal, and an output signal of the low-pass signal branch may have a phase delay in comparison with an input signal. In the single-end 180° phase shift unit, when Vctrl and Vctrl_m are mutually inverting control signals (Vctrl=0 and Vctrl_m=1, or Vctrl=1 and Vctrl_m=0), the single-end 180° phase shift unit works normally. When Vctrl=0 and Vctrl_m=1, the signal path is a low-pass phase shift network, and a −90 phase shift may be generated; or when Vctrl=1 and Vctrl_m=0, the signal path is a high-pass phase shift network, and a +90° phase shift may be generated. The high-pass/low-pass phase shift network is connected alternately, and a phase shift resolution of the phase shift unit of the bit can be obtained: 90°−(−90°)=180°, that is, the bit can form a 180° phase shift.

Figure 6:
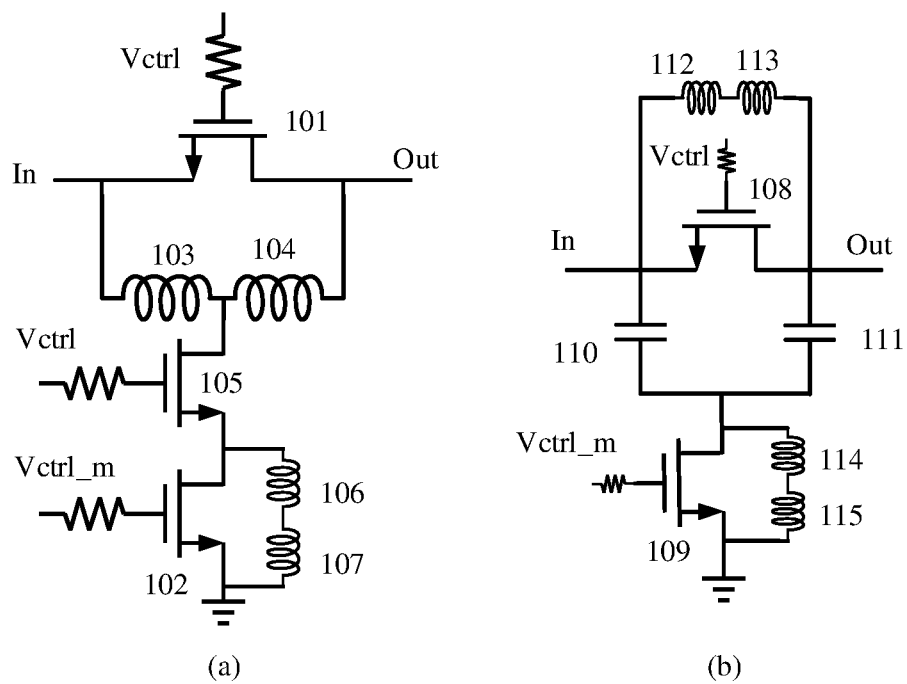
FIG. 6 is a schematic diagram of a structure of a phase shift network of a low-bit phase shift unit according to an embodiment of this application.

For a phase shift network of a phase shift unit of a low bit in the n bits, refer to (a) and (b) in FIG. 6. A phase shift is implemented by using a T-type low-pass network in (a) in FIG. 6, and a phase shift is implemented by using a π-type low-pass network in (b) in FIG. 6. In the phase shift units corresponding to (a) and (b) in FIG. 6, when Vctrl and Vctrl_m are mutually inverting (Vctrl=0 and Vctrl_m=1, or Vctrl=1 and Vctrl_m=0), Vctrl=0 and Vctrl=1 correspond to two different phase shift states, and a phase shift resolution of a bit corresponding to the phase shift unit may be obtained by using a difference between the two phase shift states. For example, for (a) in FIG. 6, an equivalent circuit corresponding to Vctrl=0 (Vctrl_m=1) is in a phase shift state of a T-type low-pass network, as shown in (a) in FIG. 7; and an equivalent circuit corresponding to Vctrl=1 (Vctrl_m=0) is in a phase shift state for signal pass-through, as shown in (b) in FIG. 7, and a difference between phases in the two states is a phase shift resolution of the bit. For (b) in FIG. 6, an equivalent circuit corresponding to Vctrl=0 (Vctrl_m=1) is in a phase shift state of a π-type low-pass network, as shown in (c) in FIG. 7; and an equivalent circuit corresponding to Vctrl=1 (Vctrl_m=0) is in a phase shift state for signal pass-through, as shown in (d) in FIG. 7, and a difference between phases in the two states is a phase shift resolution of one bit.

Figure 8:
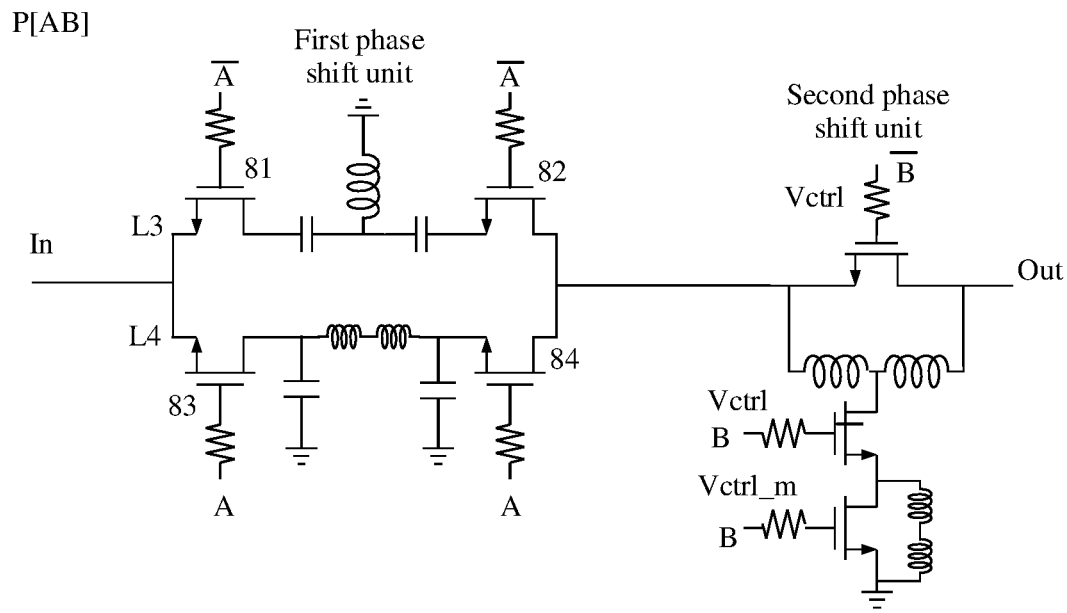
FIG. 8 shows structures of a high-bit phase shift unit and a low-bit phase shift unit according to an embodiment of this application.

With reference to the foregoing examples of the phase shift units of the high bit and low bit in the n bits, a phase shifter shown in FIG. 8 includes a high-bit first phase shift unit and a low-bit second phase shift unit that are connected in series. Control ends of the first phase shift unit and the second phase shift unit correspond to two different bits A and B. For example, when P(AB)=00, a control word Vctrl of a port B is 0, and a control word Vctrl_m of a port $\overline{\text{B}}$ is 1. Referring to an operating principle of (a) in FIG. 6, the second phase shift unit corresponds to a phase shift state for signal pass-through. Vctrl_m of a port A is 0, and Vctrl of a port $\overline{\text{A}}$ is 1. Referring to an operating principle of FIG. 5, a signal path of the first phase shift unit is a high-pass phase shift network. Based on this principle, a 4-bit phase shifter is used as an example. When P(AB)=00 changes to P(AB)= 10, the phase shifter shown in FIG. 8 may generate a 180° phase shift; when P(AB)=00 changes to P(AB)=01, the phase shifter shown in FIG. 8 may generate a 90° or 45° or 22.5° (specifically related to an inductance value and a capacitance value of a capacitor in the second phase shift unit) phase shift; when P(AB)=00 changes to P(AB)=01, the phase shifter shown in FIG. 8 may generate a 90° or 45° or 22.5° phase shift; or when P(AB)=11 changes to P(AB)=00, the phase shifter shown in FIG. 8 may generate a 180°+(90° or 45° or 22.5°) phase shift.

After the operating principle of the phase shifter in the radio-frequency chip is learned, it may be understood that, in the radio-frequency chip of the phased array, functions of the receiver and the transmitter may be implemented by using the foregoing structure with a plurality of branches. To implement the functions of the receiver and the transmitter, each branch may include a receiving path and a transmitting path, and both the receiving path and the transmitting path include a phase shifter. When the phase shifters in the plurality of branches are used for reception or transmission, different phase shifts may be generated. In a branch shown in FIG. 1, TR switching is implemented by using a single pole double throw switch, and there is no requirement on bidirectional reciprocity of phase shifters on the branch, that is, a phase shifter on the receiving path is only used for reception, and a phase shifter on the transmitting path is only used for transmission. The phase shifter is easy to implement. However, because this structure uses two phase shifters, a component loss is relatively large.

Figure 9:
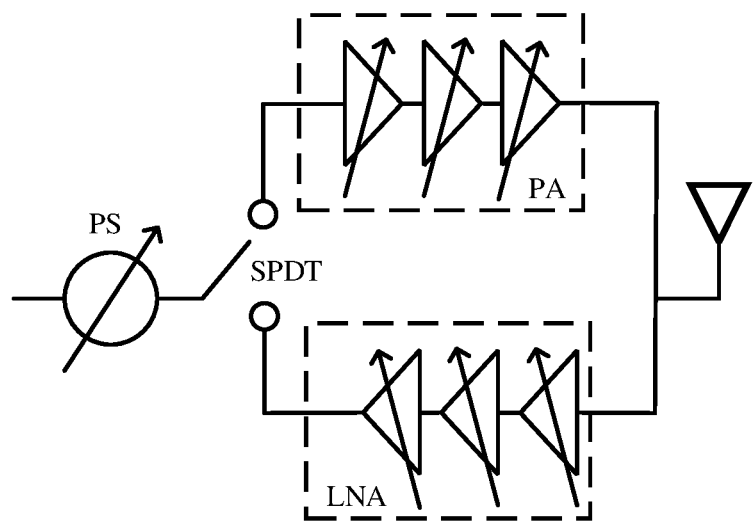
FIG. 9 is a schematic diagram of a structure of a branch of a phased array radio frequency front end.

In addition, there is also another structure of a branch of a phased array radio frequency front end. Referring to FIG. 9, a receiving path and a transmitting path share one phase shifter, and TR switching is implemented by using a single pole double throw switch. In this structure, there is a requirement on bidirectional reciprocity of the phase shifter, that is, the phase shifter on each branch is used for both reception and transmission, and the phase shifter is generally implemented by using a passive structure. In this structure, one phase shifter is used. In comparison with the structure in FIG. 1, a quantity of components of the radio-frequency chip is reduced. However, because there is still a single pole double throw switch, a component loss is still relatively large.

Therefore, in this application, through evolution of the structure of the branch shown in FIG. 9, a circuit structure that reuses a switch isolation function of the phase shifter to implement TR switching is provided. The structure may be used for a radio-frequency chip, and can reduce a loss caused by using redundant components.

Figure 10:
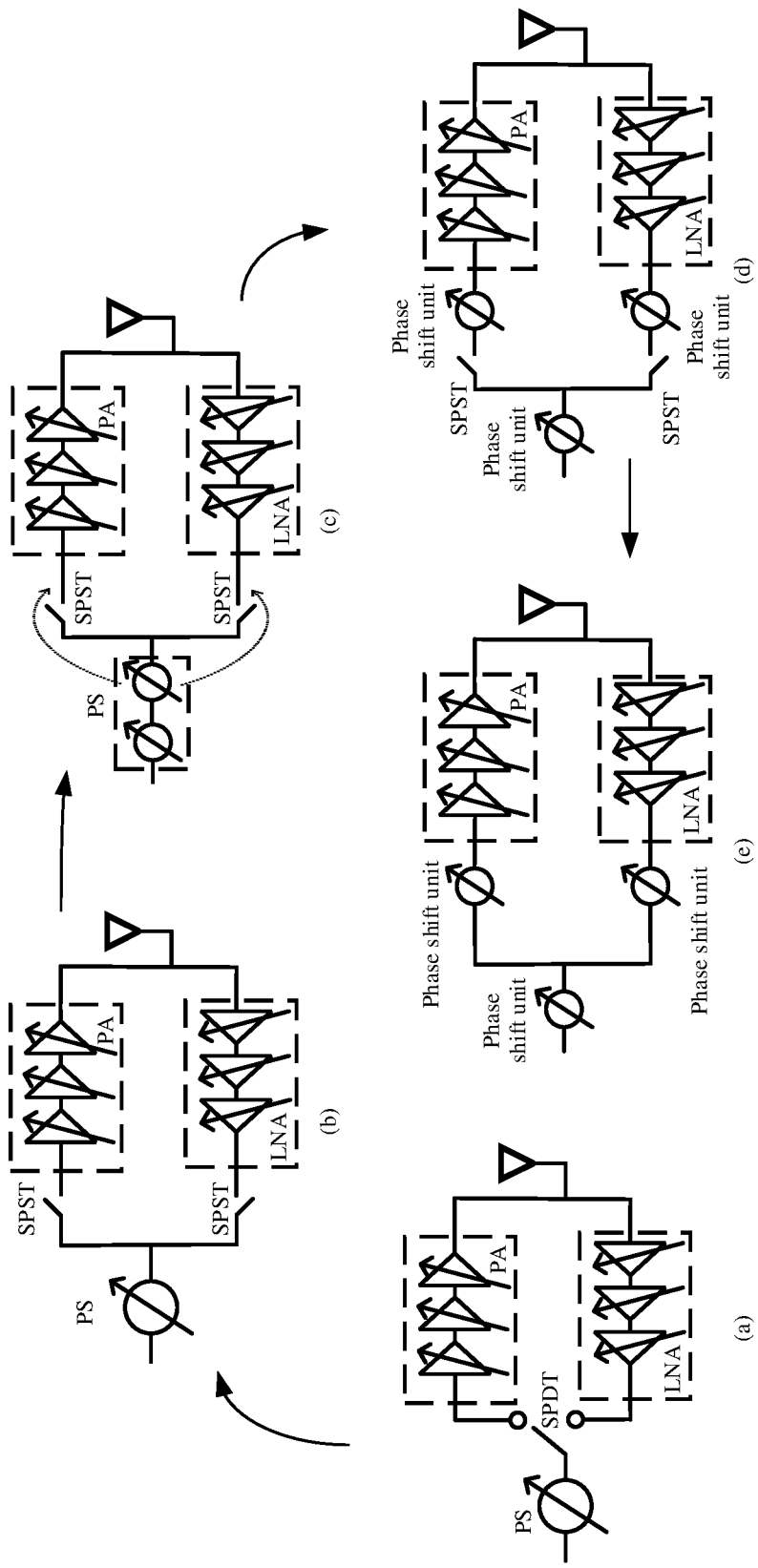
FIG. 10 is a schematic diagram of evolution of the structure of the branch in FIG. 9 according to an embodiment of this application to obtain a structure of a branch provided in this application.

FIG. 10 shows evolution of the structure of the branch in FIG. 9 in this application to obtain a structure of a branch provided in this application. (a) in FIG. 10 is a diagram of a structure of a commonly used branch at present. In the structure, a transmitting path and a receiving path share one phase shifter, and a single pole double throw switch is used to implement switching. In (b) in FIG. 10, the single pole double throw switch in (a) in FIG. 10 is replaced with a single pole single throw switch (single pole single throw, SPST) on each of the transmitting path and the receiving path. A phase shifter on a common path in (b) in FIG. 10 may be divided into two parts to obtain (c) in FIG. 10, and then some phase shift units of the phase shifter in (c) in FIG. 10 may be placed on the transmitting path and the receiving path to obtain a structure of the branch shown in (d) in FIG. 10. If combined functions of the SPST and the phase shift units on the transmitting path and the receiving path in (d) in FIG. 10 are implemented by using special phase shift units having switch functions, a structure of a branch shown in (e) in FIG. 10 may be obtained. The structure of the branch shown in (e) in FIG. 10 is a circuit structure for implementing TR switching by using switch features of the special phase shift units according to this application. Because the single pole double throw switch on the path is spared, a path loss in the circuit structure can be reduced.

Figure 11:
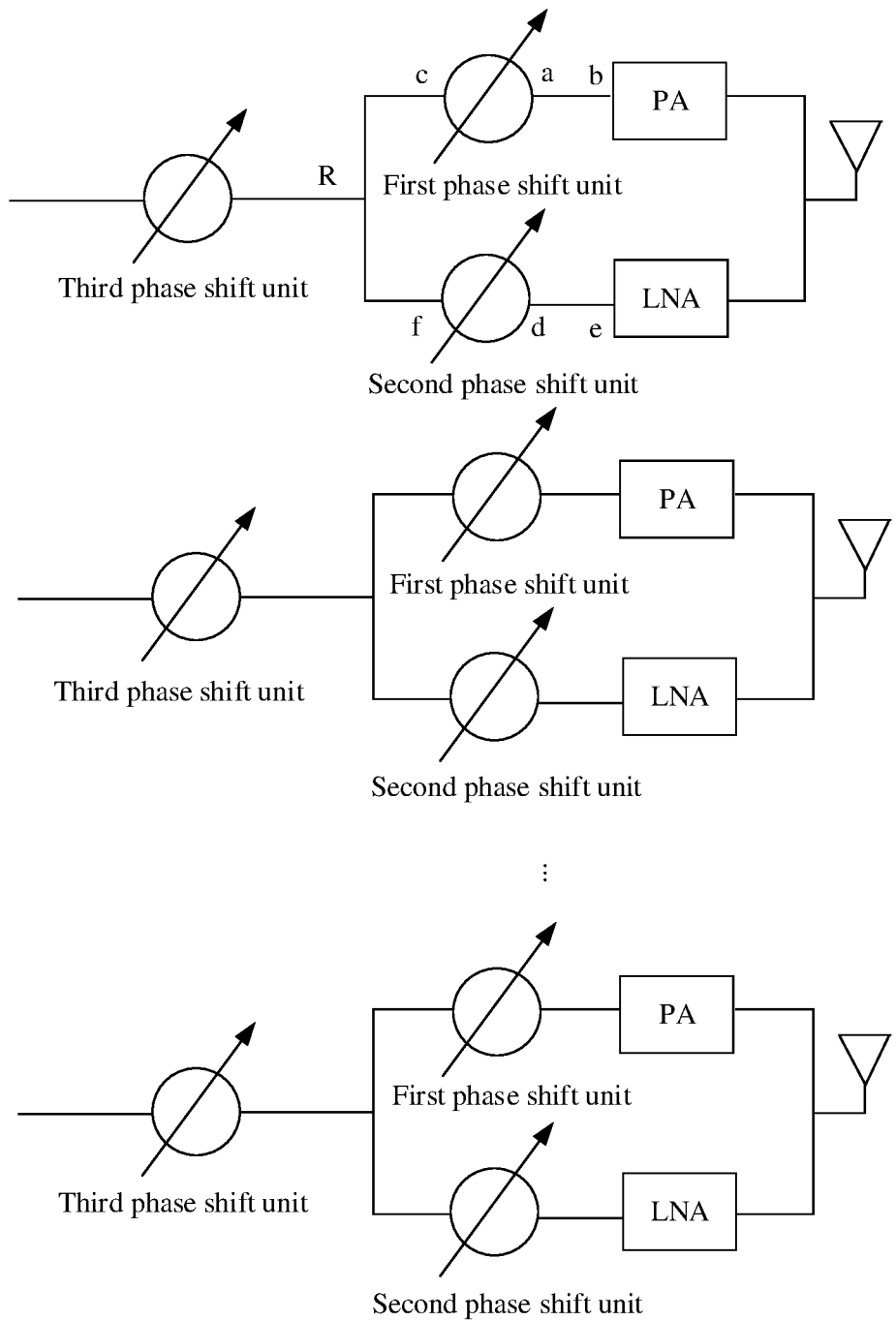
FIG. 11 is a schematic diagram of a structure of a phased array of a radio-frequency chip according to an embodiment of this application.

Therefore, based on evolution of the structure of the existing branch in this application, a radio-frequency chip is provided. Referring to FIG. 11, the radio-frequency chip includes a phased array including a plurality of branches. Each of the plurality of branches includes a transmitting path, a receiving path, a common path, and a phase shifter 11. The phase shifter 11 includes a first phase shift unit, a second phase shift unit, and a third phase shift unit; the first phase shift unit is located on the transmitting path; the second phase shift unit is located on the receiving path; and the third phase shift unit is located on the common path, where the phase shifter has a control interface, and the control interface is configured to provide a corresponding phase shift control signal and a corresponding turn-off control signal for the first phase shift unit and the second phase shift unit respectively.

The first phase shift unit is configured to provide, based on the control signal, a phase shift or turn-off operation for a signal transmitted on the transmitting path. The second phase shift unit is configured to provide, based on the control signal, a phase shift or turn-off operation for a signal transmitted on the receiving path.

In FIG. 11, a PA is located on the transmitting path and an LNA is located on the receiving path.

Because the first phase shift unit of the phase shifter 11 is located on the transmitting path and the second phase shift unit is located on the receiving path, it can be learned that, in this application, some phase shift units of the phase shifter are placed on the transmitting path and the receiving path. The phase shift unit on the transmitting path and the phase shift unit on the receiving path may have both a phase shift function and a switch function. In this way, when TR switching is implemented, use of a switch can be avoided, an insertion loss is reduced, and a path loss is reduced.

According to the foregoing description of the operating principle of the phase shifter, digital control bits corresponding to the first phase shift unit and the third phase shift unit are different. Therefore, a phase shift resolution corresponding to the first phase shift unit may be different from a phase shift resolution corresponding to the third phase shift unit. Similarly, a phase shift resolution corresponding to the second phase shift unit is also different from the phase shift resolution corresponding to the third phase shift unit. For example, the first phase shift unit and the second phase shift unit are the same, and may be the foregoing single-end 180° phase shift unit with the phase shift resolution of 180°. When all switches of the single-end 180° phase shift unit are turned off, the single-end 180° phase shift unit can be used as a switch and is in an off state. When control signals of the switches of the single-end 180° phase shift unit are mutually inverting, a 180° phase shift can be implemented. A specific implementation is described later. The third phase shift unit may be the foregoing T-type low-pass network or π-type low-pass network, and the phase shift resolution thereof may be 22.5°, 45°, 90°, or the like.

It should be noted that, in addition to the third phase shift unit, the common path may further include a plurality of other phase shift units corresponding to digital control bits. For example, the common path may further include a fourth phase shift unit and a fifth phase shift unit.

In some embodiments, digital control bits corresponding to the first phase shift unit and the second phase shift unit in the phase shifter are the same. In other words, the phase shift resolution of the first phase shift unit is the same as the phase shift resolution of the second phase shift unit. The digital control bit is used to control the receiving path to be disconnected when the transmitting path of the branch works; or control the transmitting path to be disconnected when the receiving path works. When the transmitting path works and the receiving path is disconnected, the digital control bit is used to control the first phase shift unit to work and the second phase shift unit to be turned off. When the transmitting path is disconnected and the receiving path works, the digital control bit is used to control the first phase shift unit to be turned off and the second phase shift unit to work. Therefore, the same digital control bit can be used to instruct the first phase shift unit to work and the second phase shift unit to be turned off, or instruct the first phase shift unit to be turned off and the second phase shift unit to work.

The phase shifter 11 may be a digital phase shifter, and the phase shift control signal includes a plurality of digital control bits. It may be understood that a digital control bit corresponding to the first phase shift unit is higher than a digital control bit corresponding to the third phase shift unit. In other words, the phase shift resolution of the first phase shift unit is different from the phase shift resolution of the third phase shift unit. Because the digital control bit corresponding to the first phase shift unit is the same as the digital control bit of the second phase shift unit, the digital control bit corresponding to the second phase shift unit may be higher than the digital control bit corresponding to the third phase shift unit. For example, if digital control bits corresponding to the phase shifter 11 are 10, a phase shift unit corresponding to a bit "1" is the first phase shift unit, and a phase shift unit corresponding to a bit "0" is the third phase shift unit.

In some embodiments, the first phase shift unit is configured to implement a change of a series signal path by changing a switch control signal of the digital control bit. It may be understood that, the change of the series path is adjustment of two states of the first phase shift unit, and selection of two signal paths may be implemented by turning on and off switches in the first phase shift unit.

Referring to FIG. 5, when the first phase shift unit is a single-end 180° phase shift unit, and when Vctrl and Vctrl_m are mutually inverting control signals, the single-end 180° phase shift unit works normally. When Vctrl=0 and Vctrl_m=1, two switches whose control words are Vctrl_m are turned on, two switches whose control words are Vctrl are turned off, and the signal path is a series signal path in which a π-type low-pass phase shift network whose control word is Vctrl_m is located; or when Vctrl=1 and Vctrl_m=0, two switches whose control words are Vctrl are turned on, two switches whose control words are Vctrl_m are turned off, and the signal path is a series signal path in which a T-type high-pass phase shift network whose control word is Vctrl is located.

The third phase shift unit is configured to implement a change of a ground signal path by changing a switch control signal of the digital control bit. It may be understood that, the change of the ground signal path is also adjustment of two states of the third phase shift unit, and selection of ground signal paths may be implemented by turning on and off switches in the third phase shift unit. The ground signal is an alternating current ground signal.

Figure 7:
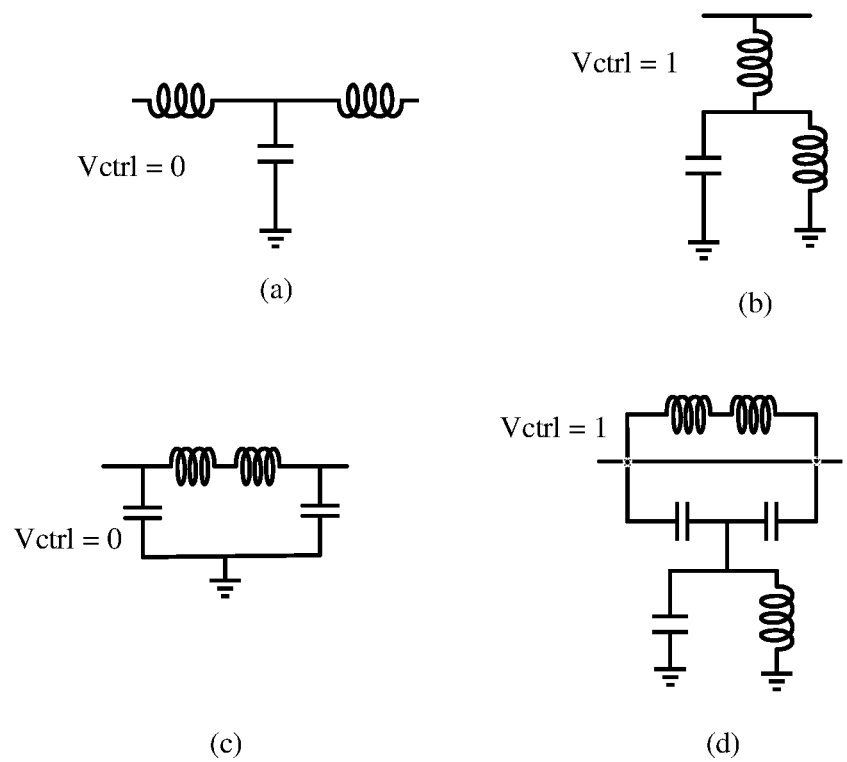
FIG. 7 is a schematic diagram of a plurality of phase shift states of a low-bit phase shift unit according to an embodiment of this application.

Referring to (a) in FIG. 6, Vctrl=0 and Vctrl_m=1 correspond to a T-type low-pass network shown in (a) in FIG. 7; and Vctrl=1 and Vctrl_m=0 correspond to a signal pass-through in (b) in FIG. 7.

Referring to FIG. 11, in terms of a connection relationship, a first end a of the first phase shift unit is connected to one end b of the PA, and a second end c of the first phase shift unit is connected to the third phase shift unit.

A first end d of the second phase shift unit is connected to one end e of the LNA, and a second end f of the second phase shift unit is connected to the third phase shift unit.

The first phase shift unit, the second phase shift unit, and the third phase shift unit are jointly connected to a same node R; and when the branch of the phased array is configured to transmit signals, the transmitted signals phase-shifted by the first phase shift unit enter the third phase shift unit through the same node R; or when the branch of the phased array is configured to receive signals, the received signals phase-shifted by the third phase shift unit enter the second phase shift unit through the same node R.

In some embodiments, the first phase shift unit on the transmitting path or the second phase shift unit on the receiving path may be implemented in a plurality of manners. For example, the first phase shift unit and the second phase shift unit may have a differential signal structure, or may have a single-end input and single-end output structure.

Figure 12:
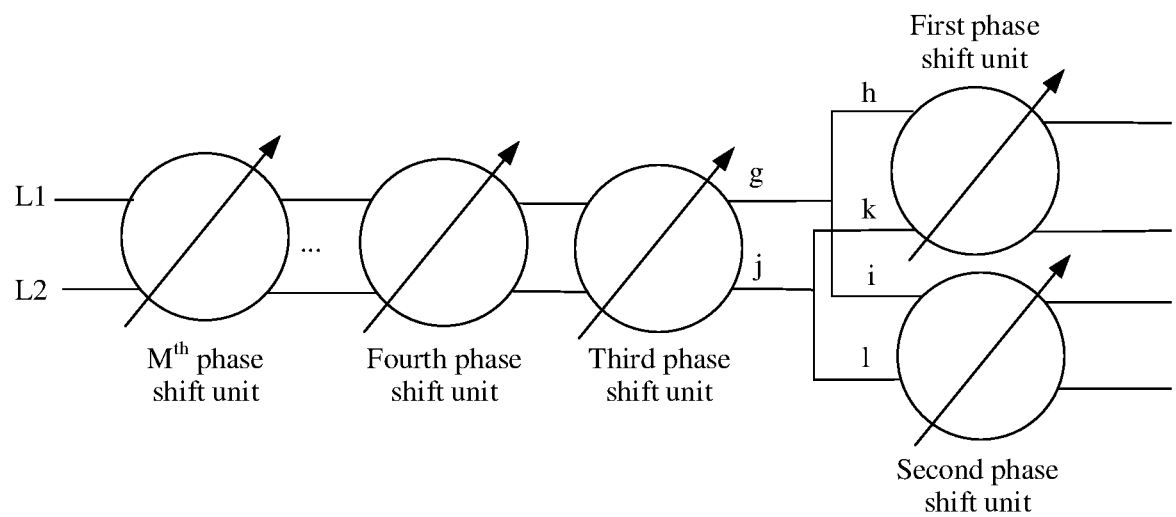
FIG. 12 is a schematic diagram of a structure when a phase shifter on a branch has a differential signal structure according to an embodiment of this application.

For example, the first phase shift unit has a differential signal structure. Referring to FIG. 12, the phase shifter 11 on one branch may include a first path L1 and a second path L2 that constitute a differential path, and the first path L1 and the second path L2 include a plurality of phase shift units connected in series. The plurality of phase shift units connected in series include the third phase shift unit. FIG. 11 further illustrates a fourth phase shift unit and an $M^{th}$ phase shift unit connected in series to the third phase shift unit. The phase shifter 11 may be a phase shifter controlled by (M−1) digital control bits.

An output end g of the first path is coupled to an input end h of the first phase shift unit, and the output end g of the first path is coupled to an input end i of the second phase shift unit; and an output end j of the second path is coupled to an input end k of the first phase shift unit, and the output end j of the second path is coupled to an input end l of the second phase shift unit.

It should be noted that, in this embodiment of this application, the input end may be further used as an output end, and the input end may be further used as an output end.

Figure 13:
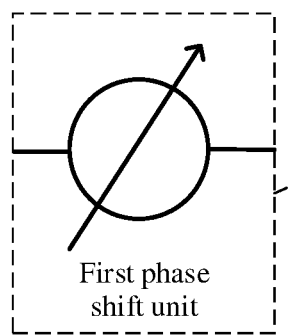
FIG. 13 is a schematic diagram of a structure of a first phase shift unit of a phase shifter according to an embodiment of this application.
Figure 13:
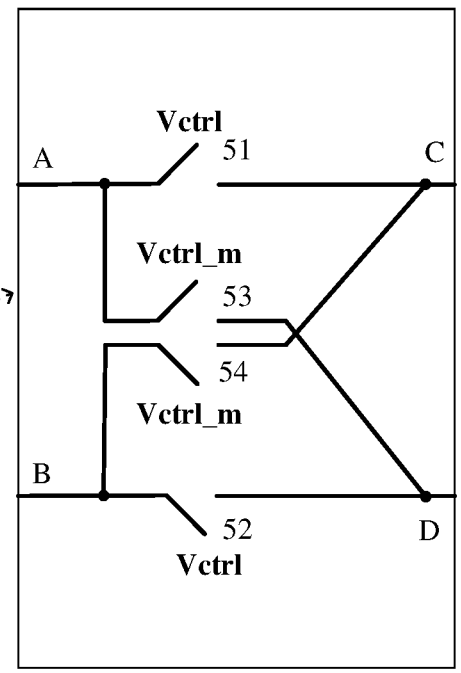

Referring to the differential signal structure in FIG. 12, FIG. 13 is a diagram of a structure of a first phase shift unit of a phase shifter 10. For a diagram of a structure of a second phase shift unit, refer to the first phase shift unit.

Referring to FIG. 13, the first phase shift unit may include two groups of switches: a first group of switches and a second group of switches. The first group of switches includes a first switch 51 and a second switch 52 in FIG. 13, and the second group of switches includes a third switch 53 and a fourth switch 54 in FIG. 13. The first phase shift unit further includes a differential input end and a differential output end, the differential input end includes a first input end A and a second input end B, and the differential output end includes a first output end C and a second output end D. The first switch 51 is coupled between the first input end A and the first output end C, the second switch 52 is coupled between the second input end B and the second output end D, the third switch 53 is coupled between the first input end A and the second output end D, and the fourth switch 54 is coupled between the second input end B and the first output end C.

In some embodiments, the switches used in this application may be MOS transistors, and may be specifically NMOS transistors or PMOS transistors.

In some embodiments, a phase shift control signal is used to provide mutually inverting control signals for the first group of switches and the second group of switches, and a turn-off control signal is used to provide mutually non-inverting control signals for the first group of switches and the second group of switches.

It may be understood that the first phase shift unit shown in FIG. 13 includes two groups of crossbars. If control signals of the first switch 51 and the second switch 52 of the first phase shift unit are denoted as Vctrl, and control signals of the third switch 53 and the fourth switch 54 are denoted as Vctrl_m, when Vctrl and Vctrl_m are mutually inverting control signals (for example, Vctrl=0 and Vctrl_m=1, or Vctrl=1 and Vctrl_m=0), the first phase shift unit works normally, and a 180° phase shift can be implemented by turning on the first group of switches and the second group of switches alternately. When the two groups of switches of the first phase shift unit are both turned off, that is, when Vctrl=0 and Vctrl_m=0, the first phase shift unit is turned off. In this case, the first phase shift unit may provide a high off-state impedance to implement an isolation function. Therefore, a differential signal structure of the second phase shift unit may be the same as that of the first phase shift unit. When the first phase shift unit performs a phase shift and the second phase shift unit is turned off, or when the first phase shift unit is turned off and the second phase shift unit performs a phase shift, TR switching can be implemented.

For the phase shift, for example, it is assumed that the differential input end A inputs a high level "+", and the end B inputs a low level "−", and a difference between the high level "+" and the low level "−" is 180°. In previous control, when Vctrl=1 and Vctrl_m=0, the first switch 51 and the second switch 52 are turned on, the third switch 53 and the fourth switch 54 are turned off, the end C outputs a high level "+", and the end D outputs a low level "−". In this case, the high level "+" input by the end A=the high level "+" output by the end C, and the low level "−" input by the end B=the low level "−" output by the end D. In subsequent control, when Vctrl=0 and Vctrl_m=1, the first switch 51 and the second switch 52 are turned off, the third switch 53 and the fourth switch 54 are turned on, the end C outputs a low level "−", and the end D outputs a high level "+". In this case, the high level "+" input by the end A=the high level "+" output by the end D, and the low level "−" input by the end B=the low level "−" output by the end C. Outputs of the end C and the end D are inverting to outputs at previous turn-on of the switches. In this way, a 180° phase shift can be implemented.

Therefore, if the structure of the first phase shift unit on the transmitting path is the same as that of the second phase shift unit on the receiving path, when the first group of switches and the second group of switches in the first phase shift unit are turned on alternately, the transmitting path works normally, that is, the first phase shift unit is configured to perform a phase shift; or when both the first group of switches and the second group of switches in the first phase shift unit are turned off, the first phase shift unit is turned off. Similarly, when the first group of switches and the second group of switches in the second phase shift unit are turned on alternately, the receiving path works normally, that is, the second phase shift unit is configured to perform a phase shift; or when both the first group of switches and the second group of switches in the second phase shift unit are turned off, the second phase shift unit is turned off.

Each of the third phase shift unit to the $M^{th}$ phase shift unit may be implemented by using the phase shift network of the low-bit phase shift unit shown in (a) in FIG. 6 or (b) in FIG. 6.

For the phase shift unit of the T-type low-pass network shown in (a) in FIG. 6 and the phase shift unit of the π-type low-pass network shown in (b) in FIG. 6, both the two types of phase shift units have a passive inductor and a passive capacitor connected between an input end IN and an output end OUT of the third phase shift unit, and cannot provide a very high off-state impedance. Therefore, the two types of phase shift units cannot be reused for TR switching.

Referring to (a) in FIG. 6, the third phase shift unit includes a ninth switch 101 and a tenth switch 102, and control signals of the ninth switch 101 and the tenth switch 102 are mutually inverting control signals. A control word of the ninth switch 101 is denoted as Vctrl, and a control word of the tenth switch 102 is denoted as Vctrl_m.

A T-type low-pass network is connected between the ninth switch 101 and the tenth switch 102.

The T-type low-pass circuit includes a capacitor and an inductor.

In some embodiments, the T-type low-pass network includes a fourth inductor 103, a fifth inductor 104, and a thirteenth switch 105 connected on a common path of the fourth inductor 103 and the fifth inductor 104. A sixth inductor 106 and a seventh inductor 107 are connected in parallel with a source and drain of the tenth switch 102.

The fourth inductor 103 and the fifth inductor 104 are connected in series on the signal path, and the third phase shift unit shown in (a) in FIG. 6 has a low-pass circuit structure.

Referring to (b) in FIG. 6, the third phase shift unit includes an eleventh switch 108 and a twelfth switch 109, and control signals of the eleventh switch 108 and the twelfth switch 109 are mutually inverting control signals. A control word of the eleventh switch 108 is denoted as Vctrl, and a control word of the twelfth switch 109 is denoted as Vctrl_m.

A π-type low-pass network is connected between the eleventh switch 108 and the twelfth switch 109.

The π-type low-pass circuit includes a capacitor and an inductor.

In some embodiments, the π-type low-pass circuit includes a sixth capacitor 110 and a seventh capacitor in connected to the eleventh switch 108. The third phase shift unit further includes a sixth inductor 112 and a seventh inductor 113 connected to the eleventh switch 108, and an eighth inductor 114 and a ninth inductor 115 connected to the twelfth switch 109.

Because the sixth inductor 112 and the seventh inductor 113 in (b) in FIG. 6 are connected in series on the signal path, the third phase shift unit shown in (b) in FIG. 6 has a low-pass circuit structure.

Regardless of the third phase shift unit shown in (a) in FIG. 6 or the third phase shift unit shown in (b) in FIG. 6, according to the foregoing description of the low-bit phase shift unit, when Vctrl=0 and Vctrl_m=1, or when Vctrl=1 and Vctrl_m=0, a phase shift can be implemented.

Figure 14:
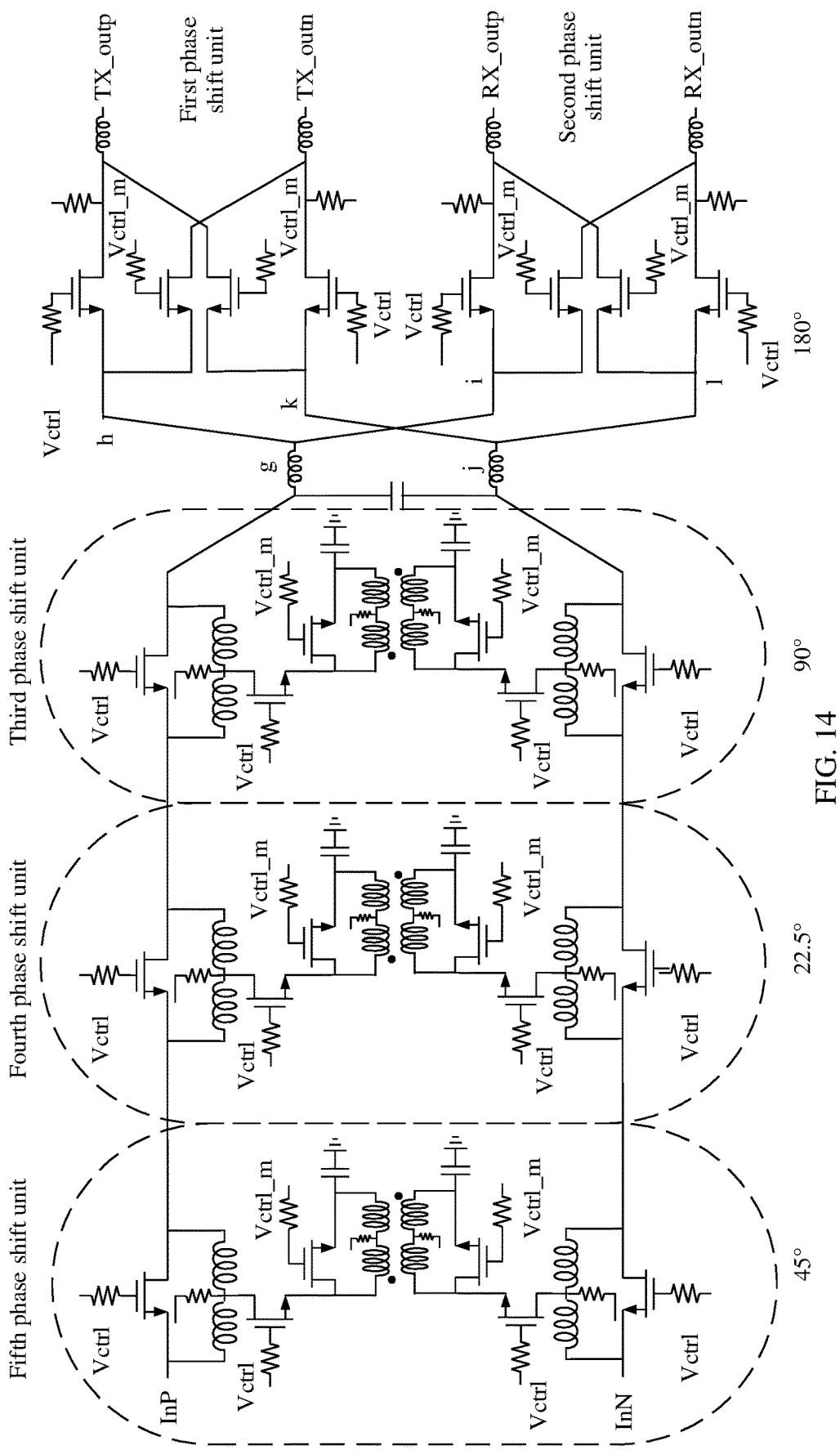
FIG. 14 is a schematic diagram of a structure of a differential 4-bit phase shifter according to an embodiment of this application.

Based on the foregoing description of the first phase shift unit and the third phase shift unit, assuming that the phase shifter 11 has a differential 4-bit signal structure and that all switches in each phase shift unit are NMOS transistors, and based on the structure of the phase shifter shown in FIG. 12, if the first phase shift unit and the second phase shift unit use the structure of the differential 180° phase shift unit shown in FIG. 13, and the third phase shift unit, the fourth phase shift unit, and the fifth phase shift unit use the structure of the low-bit phase shift unit shown in (a) in FIG. 6, the structure of the phase shifter shown in FIG. 12 may be shown in FIG. 14.

The phase shifter 11 shown in FIG. 14 includes a first path and a second path constituting a differential path. Phase shift units included in the first path and the second path are the third phase shift unit, the fourth phase shift unit, and the fifth phase shift unit. A phase shift unit on the transmitting path is the first phase shift unit. A phase shift unit on the receiving path is the second phase shift unit.

An output end g of the third phase shift unit is coupled to the input end h of the first phase shift unit, and an output end g of the third phase shift unit is coupled to the input end i of the second phase shift unit; and an output end j of the third phase shift unit is coupled to the input end k of the first phase shift unit, and the output end j of the third phase shift unit is coupled to the input end l of the second phase shift unit.

It may be understood that, for the first phase shift unit, when a gate control signal Vctrl of the first group of switches and a gate control signal Vctrl_m of the second group of switches are mutually inverting control signals, the first phase shift unit is configured to perform a phase shift; or when a gate control signal Vctrl of the first group of switches and a gate control signal Vctrl_m of the second group of switches are both low potentials, the first phase shift unit is turned off. Similarly, if the NMOS transistors are replaced with PMOS transistors, when the gate control signal Vctrl of the first group of switches and the gate control signal Vctrl_m of the second group of switches are both high potentials, the first phase shift unit is turned off.

For a part of the third phase shift unit on the first path, when Vctrl=0 and Vctrl_m=1, a corresponding phase shift state of the T-type low-pass network is shown in (a) in FIG. 7; or when Vctrl=1 and Vctrl_m=0, a corresponding phase shift state is a phase shift state for signal pass-through, and a phase difference between the two states is a phase shift resolution of one bit. The phase shift resolution of one bit of the third phase shift unit shown in FIG. 14 is 90°. Similarly, a phase shift resolution of one bit of the fourth phase shift unit shown in FIG. 14 is 22.5°, and a phase shift resolution of one bit of the fifth phase shift unit is 45°.

Figure 15:
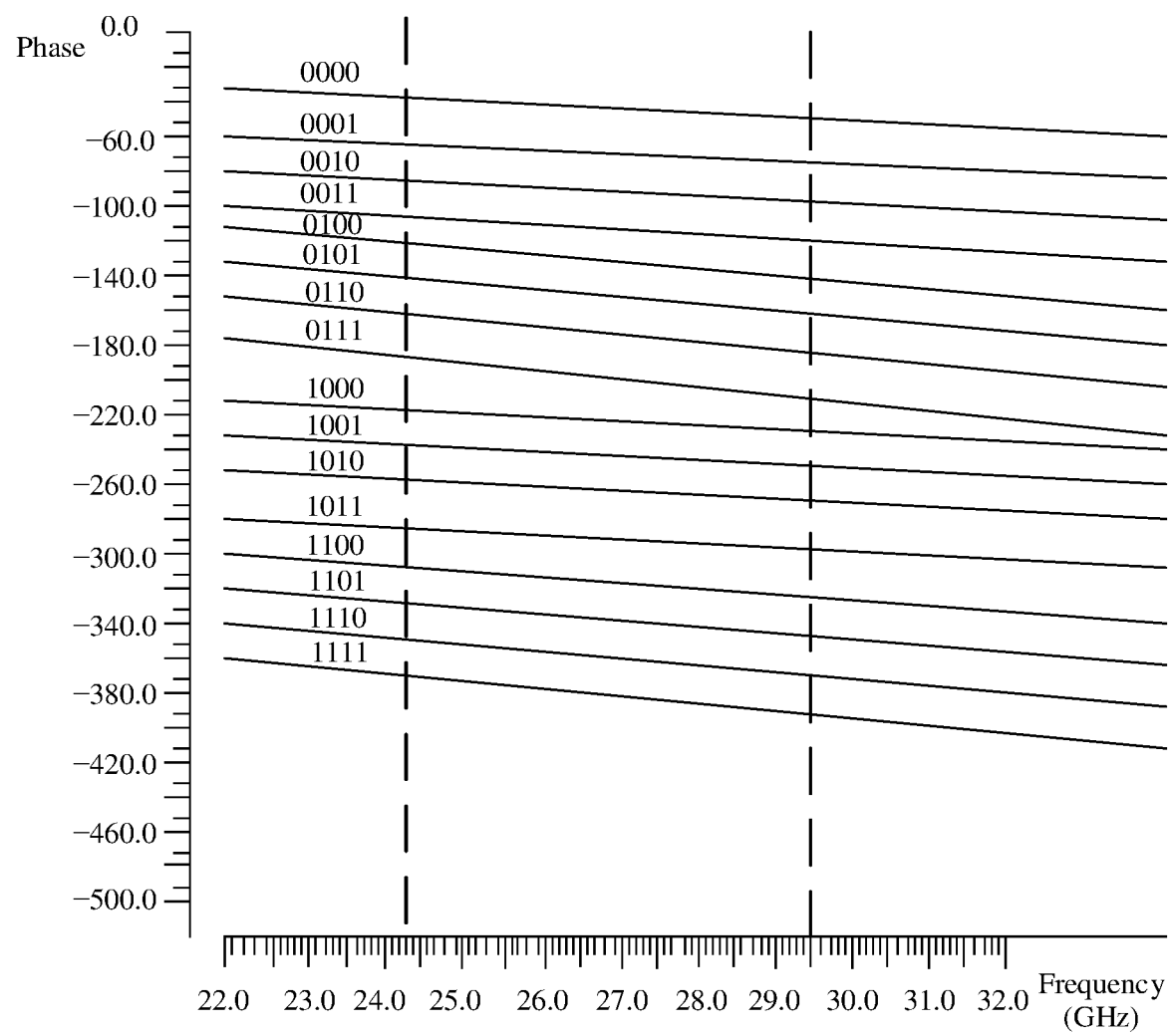
FIG. 15 is a schematic diagram of 16 bit combinations of four digital control bits in a phase shifter according to an embodiment of this application.

For example, according to an example of the phase shifter 11 having a differential 4-bit signal structure in FIG. 14, four digital control bits of the phase shifter 11 shown in FIG. 14 may have 16 bit combinations 0000 to 1111 shown in FIG. 15. If the phased array includes eight branches, digital control bits of differential 4-bit phase shifters on the eight branches may be eight of the 16 bit combinations.

For a phase shifter 11, when four digital control bits are 0000, it means that a phase shift of the phase shifter 11 is 0°. When the four digital control bits are 1111, it means that a phase shift of the phase shifter 11 is 337.5°, that is, each phase shift unit in the phase shifter 11 is in a phase shift state.

For example, if the phase shifter 11 on a branch is to implement a 90° phase shift, digital control bits of the phase shifter 11 on the branch are 0100. To be specific, in the third phase shift unit, both Vctrl and Vctrl_m at a previous moment and a subsequent moment are mutually inverting control signals. For example, in the third phase shift unit at the previous moment, Vctrl=0.9 V and Vctrl_m=0 V; in the third phase shift unit at the subsequent moment, Vctrl=0 V and Vctrl_m=0.9 V; and a phase difference between the previous moment and the subsequent moment is 90°. In this case, to enable the transmitting path to work and enable the receiving path to be disconnected, the first phase shift unit needs to implement signal pass-through. In this case, the control signals of the first group of switches may be Vctrl=0.9 V and Vctrl_m=0 V, and the second phase shift unit needs to implement an off-state impedance. For the first group of switches and the second group of switches in the second phase shift unit at the previous moment and the subsequent moment, Vctrl=Vctrl_m=0 V. In the fourth phase shift unit and the fifth phase shift unit at the previous moment and the subsequent moment, Vctrl=1 and Vctrl_m=0. In other words, the fourth phase shift unit and the fifth phase shift unit also implement signal pass-through. Therefore, a phase shift of a signal output by the transmitting path is 90° relative to a phase shift of the phase shifter whose digital control bits are 0000.

For another example, if the phase shifter 11 on a branch is to implement a 270° phase shift, the digital control bits of the phase shifter 11 on the branch are 1100. To enable the transmitting path to work and enable the receiving path to be disconnected, Vctrl and Vctrl_m of the first phase shift unit at the previous moment and the subsequent moment are both mutually inverting control signals. For example, in the first phase shift unit at the previous moment, Vctrl=0.9 V and Vctrl_m=0 V; in the first phase shift unit at the subsequent moment, Vctrl=0 V and Vctrl_m=0.9 V; and a phase difference between the previous moment and the subsequent moment is 180°. In this case, the second phase shift unit needs to implement an off-state impedance, and for the first group of switches and the second group of switches in the second phase shift unit at the previous moment and the subsequent moment, Vctrl=Vctrl_m=0 V. In addition, in the third phase shift unit at the previous moment, Vctrl=0.9 V and Vctrl_m=0 V; at the subsequent moment, Vctrl=0 V and Vctrl_m=0.9 V; and a phase difference between the previous moment and the subsequent moment is 90°. In the fourth phase shift unit and the fifth phase shift unit at the previous moment and the subsequent moment, Vctrl=1 and Vctrl_m=0. In other words, the fourth phase shift unit and the fifth phase shift unit implement signal pass-through. Therefore, a phase shift of a signal output by the transmitting path is 270° relative to a phase shift of the phase shifter whose digital control bits are 0000.

According to the foregoing description of the example of the phase shifter 11 with a differential 4-bit signal structure, when the differential 180° first phase shift unit in the phase shifter 11 is placed on the transmitting path and the differential 180° second phase shift unit is placed on the receiving path, the first phase shift unit and the second phase shift unit can implement a phase shift function and a turn-off function. In this way, while phase shifts are implemented, switch functions of the first phase shift unit and the second phase shift unit are also reused, and an SPDT can be spared, thereby reducing a switching loss.

Figure 16:
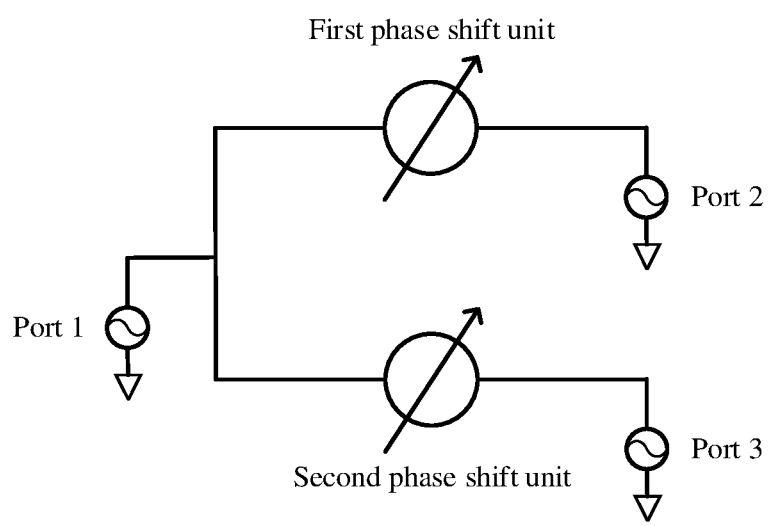
FIG. 16 is a schematic diagram of a test circuit established for a phase shifter with a differential signal structure according to an embodiment of this application.

FIG. 16 is a test circuit established for a phase shifter with a differential signal structure according to this application. A receiving path (RX shown in FIG. 16) and a transmitting path (TX shown in FIG. 16) use one phase shift unit respectively. A first phase shift unit on the transmitting path is in a normal working mode, and a second phase shift unit on the receiving path is in an off mode. A port 1, a port 2, and a port 3 are three test ports.

Figure 17:
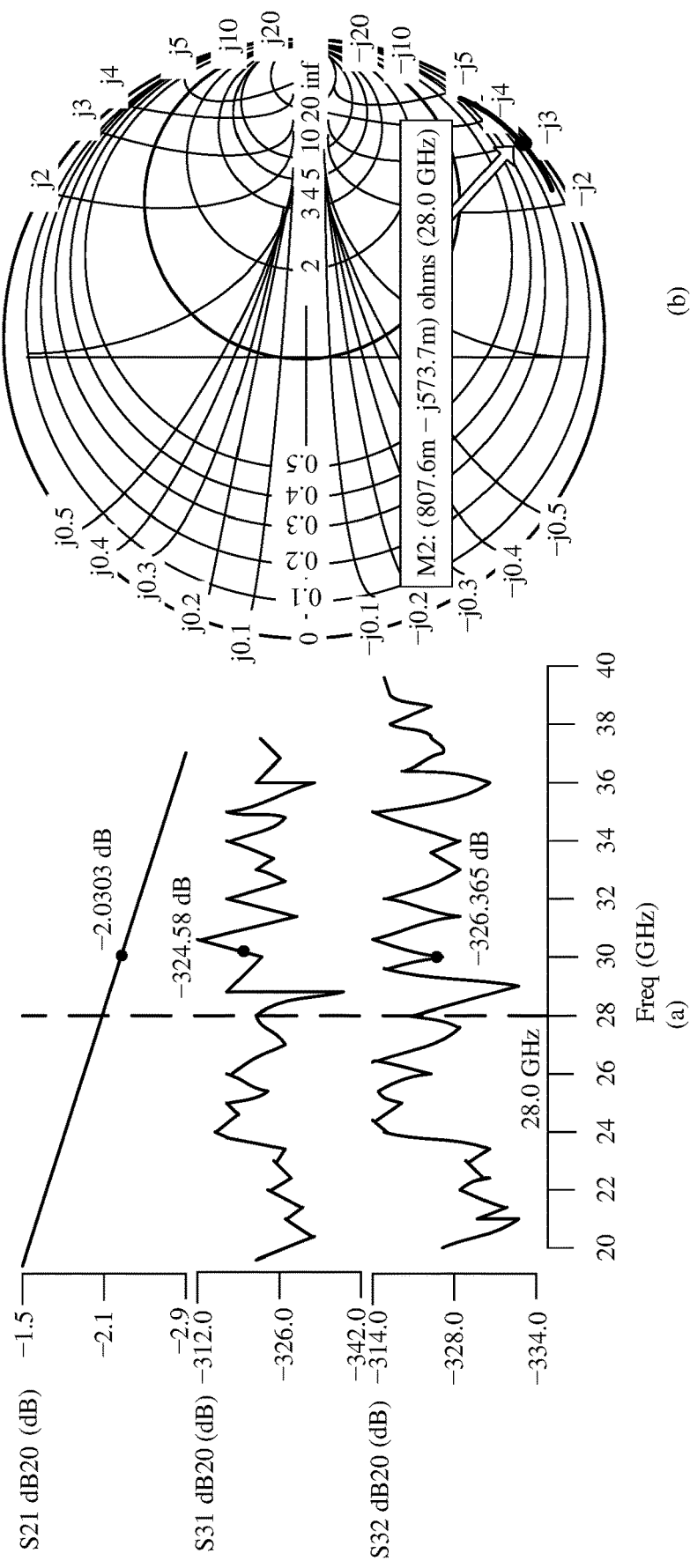
FIG. 17 is a schematic diagram of simulation results of a receiving path and a transmitting path according to an embodiment of this application.

After testing, simulation results of the receiving path and the transmitting path shown in FIG. 14 in a 28 nm CMOS process are shown in FIG. 17. As shown in (a) in FIG. 17, when a radio-frequency chip is at a frequency of 28 GHz, an insertion loss S21 of the transmitting path working normally is 2 dB, an insertion loss S31 of the receiving path in an off state is as high as 324 dB, and isolation S32 between the receiving path and the transmitting path is as high as 326 dB. (b) in FIG. 17 is an off-state impedance of the receiving path. It can be learned from (b) in FIG. 17 that the off-state impedance is in a high impedance region within a very wide bandwidth range. A real part of the off-state impedance is as high as 4.88-2.94 kΩ within a range of 20-30 GHz.

It can be learned from the simulation results in FIG. 17 that the first phase shift unit with the differential signal structure illustrated in FIG. 13 can provide a sufficiently high off-state impedance to implement an isolation function when all switches are turned off, and can be used to implement TR switching.

If the first phase shift unit or the second phase shift unit has a single-end input and single-end output structure, the first phase shift unit and the second phase shift unit having the differential signal structure in FIG. 14 may be replaced with the single-end 180° phase shift unit of the high-pass/low-pass phase shift network shown in FIG. 8.

The first phase shift unit shown in FIG. 8 includes a third path L3 and a fourth path L4. A first group of switches (a fifth switch 81 and a sixth switch 82) is on the third path L3, and a second group of switches (a seventh switch 83 and an eighth switch 84) is on the fourth path L4, and the third path L3 and the fourth path L4 are connected in parallel.

The third path L3 further includes a T-type high-pass circuit connected in series to the first group of switches, and the T-type high-pass circuit includes a capacitor and an inductor. The fourth path L4 further includes a π-type low-pass circuit connected in series to the second group of switches, and the π-type low-pass circuit includes a capacitor and an inductor.

Based on the phase shifter with a single-end 180° phase shift unit of a high-pass/low-pass phase shift network shown in FIG. 8, in some embodiments, if control words of the fifth switch 81 and the sixth switch 82 are denoted as Vctrl and control words of the seventh switch 83 and the eighth switch 84 are denoted as Vctrl_m, when Vctrl=0 and Vctrl_m=1, or Vctrl=1 and Vctrl_m=0, the T-type high-pass circuit and the π-type low-pass circuit can be used to generate a ±90° phase shift respectively, thereby implementing a 180° phase shift.

When the control signals Vctrl of the fifth switch 81 and the sixth switch 82 and the control signals Vctrl_m of the seventh switch 83 and the eighth switch 84 in the single-end 180° phase shift unit are all 0, the single-end 180° phase shift unit can implement a switch function.

As mentioned above, regardless of whether the first phase shift unit and the second phase shift unit on the transmitting path and the receiving path provided in this application have a differential signal structure or a structure of a single-end 180° phase shift unit, switches in the phase shift unit on the path may be MOS transistors. For a CMOS process, the phase shift unit on the path may be implemented by using the NMOS transistor shown in FIG. 18. In the NMOS transistor, a gate, a source, a drain, and a bulk of the NMOS transistor are all connected to resistors. To better implement TR switching, a voltage boost technology may be used, or a combination of a voltage boost technology and a bulk voltage adjustable technology is used to increase an off-state impedance when the switch is turned off.

Figure 18:
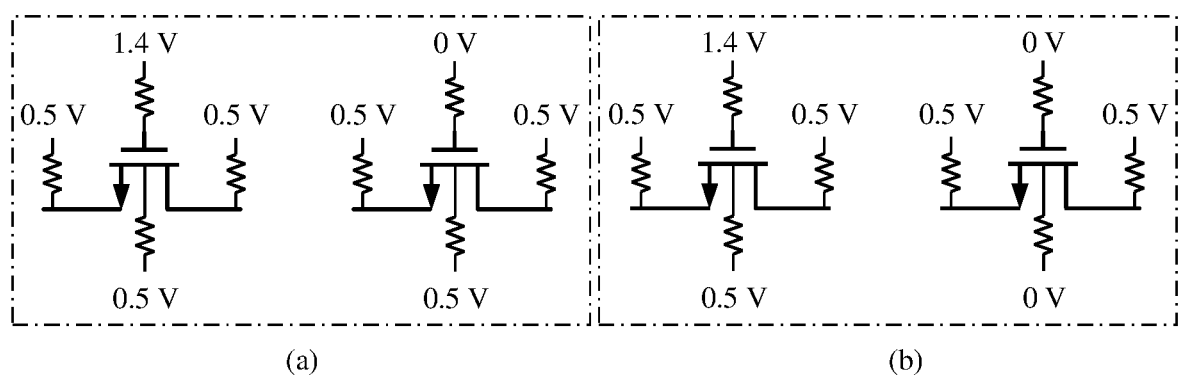
FIG. 18 is a schematic diagram of a voltage boost technology used when a phase shift unit on a path is implemented by using an NMOS transistor according to an embodiment of this application.

As shown in (a) in FIG. 18, the voltage boost technology means that when the first phase shift unit and the second phase shift unit are configured to perform a phase shift and turn-off, a source voltage, a drain voltage, and a bulk voltage of at least one switch of the first phase shift unit and the second phase shift unit are boosted. An implementation of the first phase shift unit may be as follows: A bulk of at least one switch of the first phase shift unit is coupled to a bias voltage module, the bias voltage module is configured to provide a bias voltage for the bulk of the switch, and the bias voltage is used to increase an off-state impedance of the switch. In some embodiments, the bias voltage module is further configured to provide a bias voltage for a source and drain of the at least one switch. An implementation of the second phase shift unit is the same as that of the first phase shift unit.

For example, a high level provided by the bias voltage module is 0.5 V. In this way, during a phase shift, a gate voltage of the at least one switch is boosted, that is, when the switch is turned on, the gate voltage is boosted on a basis of a standard voltage, that is, when the switch is turned on, the gate voltage of the switch is further superposed with the bias voltage. Assuming that the standard voltage of the switch is 0.9 V, because there is a 0.5 V bias voltage for each of the source voltage, the drain voltage, and the bulk voltage of the switch, when the switch is turned on, the gate voltage is boosted by 0.5 V to 1.4 V on a basis of the 0.9 V standard voltage. However, because the gate voltage and source voltage of the switch are both boosted by the same voltage value, a potential difference between the gate and the source of the switch remains unchanged before and after the voltage boost. Therefore, on-state performance of the at least one switch whose voltage is boosted remains the same as on-state performance before the voltage boost.

When the at least one switch is turned off, the gate voltage of the at least one switch is 0, and the source voltage, drain voltage, and bulk voltage continue to be boosted. In this case, the potential difference between the gate and the source of the at least one switch is less than the potential difference between the gate and the source of the at least one switch before the voltage boost. Therefore, an off-state impedance of the at least one switch is greater than an off-state impedance of the at least one switch before the voltage boost, that is, the voltage boost technology allows each switch to obtain a higher off-state impedance, so that the switch is turned off more completely.

As shown in (b) in FIG. 18, an implementation of the combination of the voltage boost technology and the bulk voltage adjustable technology may be understood as follows: The source and drain of the at least one switch of the first phase shift unit are respectively coupled to the bias voltage module by using a resistor, and the bias voltage module is configured to provide a high level. The bulk of the at least one switch of the first phase shift unit is coupled to an adjustable bias voltage module by using a resistor, and the adjustable bias voltage module is configured to provide an optional high level or low level. In other words, the bias voltage of the bulk is adjustable.

In some embodiments, the bias voltage of the bulk may be adjusted based on an on state and an off state of the switch. For example, on a basis of the voltage boost when the switch is turned on, the bulk voltage when the switch is turned off may be changed from a high level to a low level. In other words, when the first phase shift unit and the second phase shift unit are configured to perform a phase shift and turn-off, the source voltage and the drain voltage of the at least one switch of the first phase shift unit and the second phase shift unit are boosted. During the phase shift, the bulk voltage of the at least one switch is also boosted, so that the gate voltage of the at least one switch is boosted, the potential difference between the gate and the source of the at least one switch remains unchanged, and on-state performance of the at least one switch remains unchanged. During the turn-off, the gate voltage of the at least one switch is changed to 0 V, and the bulk voltage of the at least one switch is also changed to 0 V, so that the off-state impedance of the at least one switch is greater than an off-state impedance of the at least one switch when the bulk voltage remains unchanged.

For example, when the switch is turned on, the source voltage, drain voltage, and bulk voltage of the switch are all boosted by 0.5 V, and the corresponding gate voltage is also boosted by 0.5 V to 1.4 V on a basis of a 0.9 V standard voltage. When the switch is turned off, the source voltage and the drain voltage are unchanged and are still 0.5 V, the gate voltage is 0 V, and the bulk voltage is changed from 0.5 V to 0 V. In this case, a potential difference Vbs between the source and the bulk of the switch is −0.5 V. In this case, a threshold voltage Vth of the switch increases due to a back gate effect. When the switch is turned off and a potential difference Vgs between the gate and the source is fixed, an increase of the threshold voltage Vth may further enable the switch to obtain a higher off-state impedance, so that the switch is turned off more completely.

The back gate effect may be understood as follows: In many cases, potentials of the source and bulk of the switch are different. For the NMOS transistor, the bulk is usually connected to a lowest potential of the circuit, and Vbs≤0. A magnitude of the threshold voltage Vth of the switch is related to a charge amount of a depletion layer. A larger charge amount of the depletion layer indicates greater difficulty in turning on the NMOS transistor. A higher threshold voltage Vth indicates a higher voltage required to turn on the NMOS transistor. When Vbs<0, the potential difference between the gate and the bulk increases, a thickness of the depletion layer also increases, and the charge amount of the depletion layer increases, resulting in a higher threshold voltage. As Vbs becomes smaller, the threshold voltage Vth increases, and a drain current decreases when VGS and VDS remain unchanged. Therefore, the bulk and the gate have similar functions and can also control the change of the drain current, and this is referred to as a "back gate" function.

Therefore, the circuit with the differential structure of the phase shifter or the circuit with the single-end input and single-end output structure according to this application can be used for TR switching because the circuit not only has a normal phase shift function but also can obtain a very high off-state impedance by using an appropriate logical combination of switching voltages, thereby achieving a good isolation effect.

Figure 1:
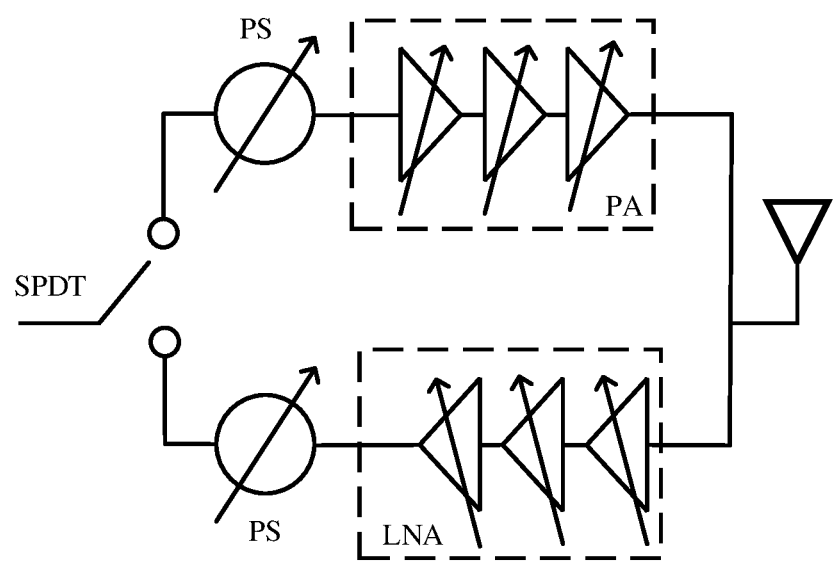
FIG. 1 is a schematic diagram of a structure of a phased array radio frequency front end TR assembly.
Figure 19:
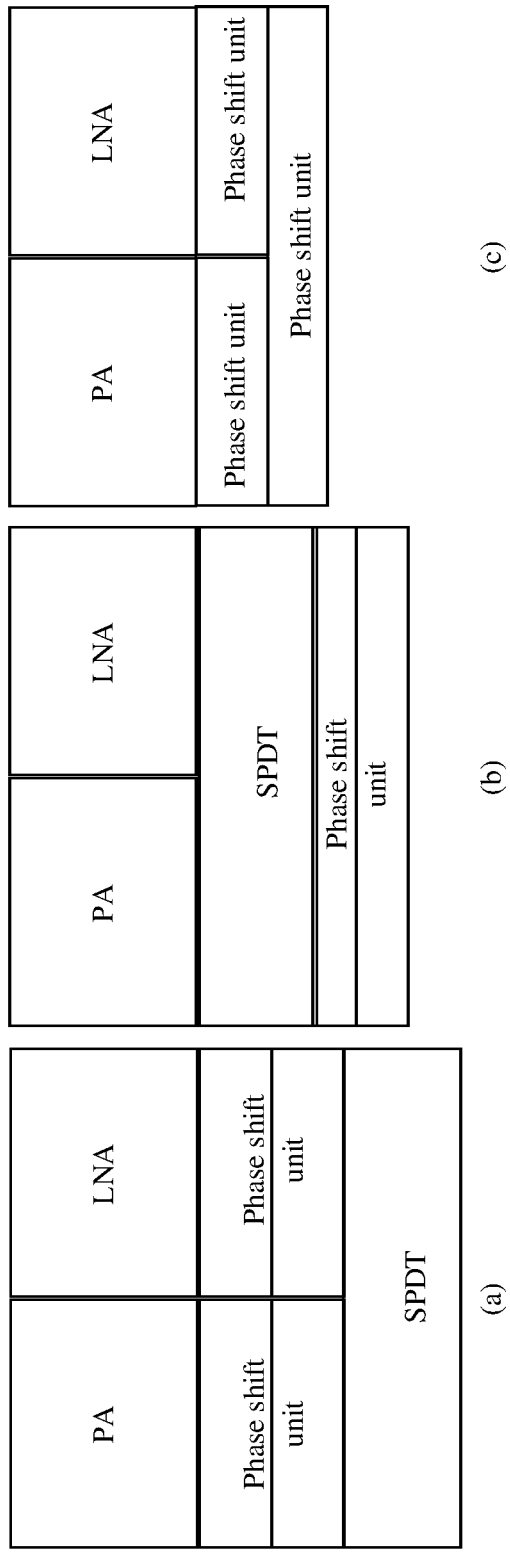
FIG. 19 is a schematic diagram of comparison of areas occupied by phase shifters shown in FIG. 1 and FIG. 9 in radio-frequency chips with a solution in which TR switching is implemented by reusing a switch isolation function of a phase shift unit according to an embodiment of this application.

FIG. 19 is a diagram of comparison of areas occupied by phase shifters shown in FIG. 1 and FIG. 9 in radio-frequency chips with a solution in which TR switching is implemented by reusing a switch isolation function of a phase shift unit according to this application. (a) in FIG. 19 is a schematic diagram of an area of a radio-frequency chip in which the existing phase shifter corresponding to FIG. 1 is located. It can be learned that, because one phase shift unit is used for each of the receiving path and the transmitting path and a single pole double throw switch SPDT is used to implement TR switching, an occupied area of the radio-frequency chip is largest. (b) in FIG. 19 is a schematic diagram of an area of a radio-frequency chip having the phase shifter corresponding to FIG. 9. It can be learned that, because the receiving path and the transmitting path share one phase shift unit and a single pole double throw switch is used for the receiving path and the transmitting path to implement TR switching, one phase shift unit is spared in comparison with (a) in FIG. 19, and an area of the radio-frequency chip is reduced in comparison with the phase shift units in (a) in FIG. 19. (c) in FIG. 19 is a TR switching assembly provided in an embodiment of this application. A phase shift unit with a switch function is disposed on each of a receiving path and a transmitting path, and a phase shift unit only used to perform a phase shift is disposed on a common path of the receiving path and the transmitting path. Because the switch function of the phase shift unit is reused in the TR switching assembly provided in this application, one SPDT can be spared, an area of a radio-frequency chip can be greatly reduced, and a component loss caused by the SPDT is also avoided. This is critical to a millimeter wave circuit design.

It should be noted that, in this embodiment of this application, TR switching is implemented by using a switch feature of the phase shifter, or TR switching may be implemented by using a switch feature of a PA or an LNA that has a special function.

Figure 20:
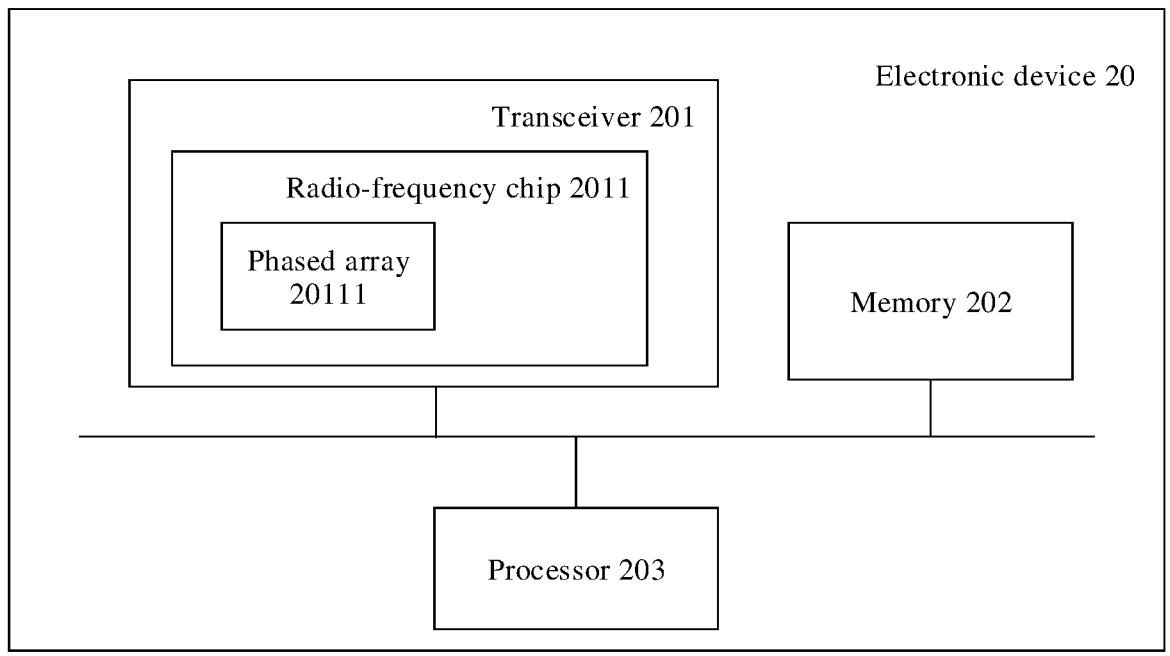
FIG. 20 is a schematic diagram of a structure of an electronic device according to an embodiment of this application.

An embodiment of this application further provides an electronic device 20. Referring to FIG. 20, the electronic device 20 may include a transceiver 201, a memory 202, and a processor 203. The transceiver 201 includes a radio-frequency chip 2011, and the radio-frequency chip 2011 includes a phased array 20111. For a structure of the phased array 20111, refer to the structure shown in FIG. 2. To be specific, the phased array includes a plurality of branches, each branch includes a transmitting path, a receiving path, a common path, and a phase shifter, and the phase shifter includes a plurality of phase shift units.

Referring to FIG. 11, the phase shift units include a first phase shift unit, a second phase shift unit, and a third phase shift unit. The first phase shift unit is located on the transmitting path; the second phase shift unit is located on the receiving path; and the third phase shift unit is located on the common path. The phase shifter has a control interface, and the control interface is configured to provide a corresponding phase shift control signal and a corresponding turn-off control signal for the first phase shift unit and the second phase shift unit respectively. The first phase shift unit is configured to provide, based on the control signal, a phase shift or turn-off operation for a signal transmitted on the transmitting path. The second phase shift unit is configured to provide, based on the control signal, a phase shift or turn-off operation for a signal transmitted on the receiving path.

The electronic device 20 shown in FIG. 20 may be a terminal device, a network device, or the like.

Figure 21:
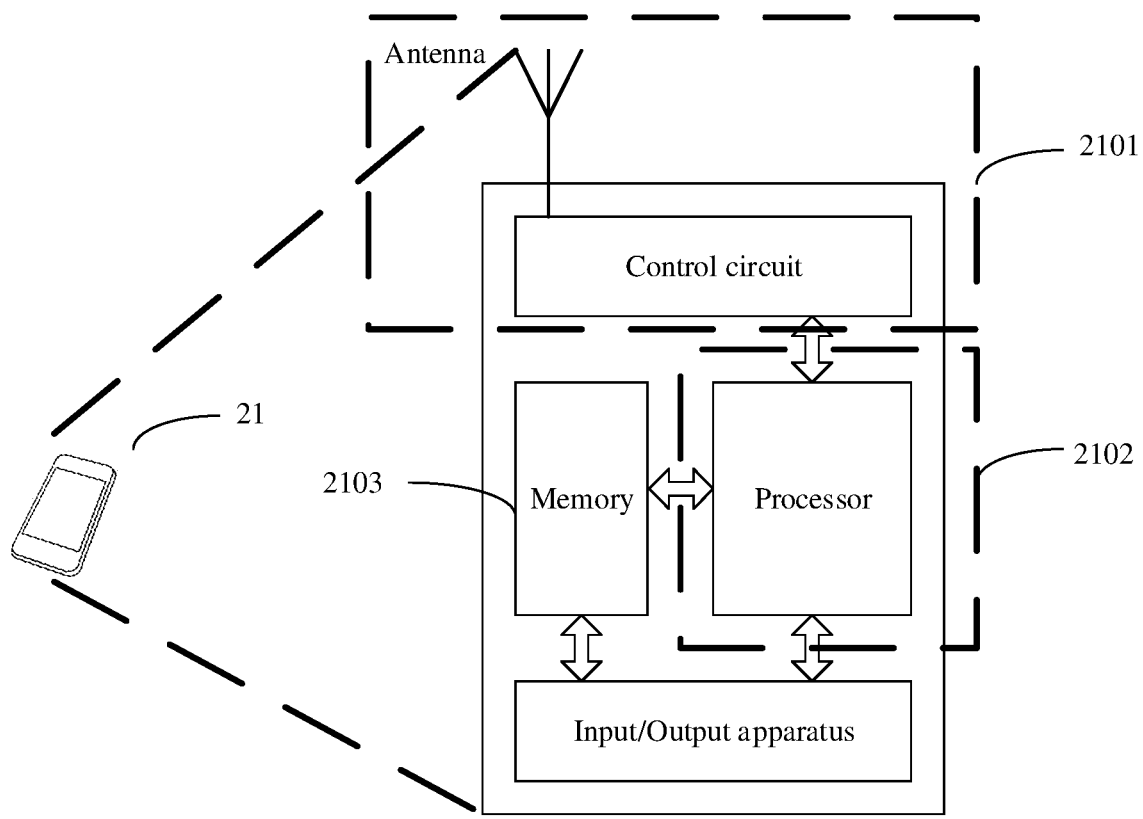
FIG. 21 is a schematic diagram of a structure of a terminal device according to an embodiment of this application.

When the electronic device 20 is a terminal device, for ease of description, FIG. 21 shows only main components of the terminal device. As shown in FIG. 21, the terminal device 21 includes a processor 2102, a memory 2103, a control circuit, an antenna, and an input/output apparatus. The processor 2102 is mainly configured to process a communication protocol and communication data, control the entire terminal device, execute a software program, and process data of the software program, for example, configured to support the terminal device 21 in performing actions described in the foregoing method embodiment. The memory 2103 is mainly configured to store a software program and data. The control circuit is mainly configured to perform conversion between a baseband signal and a radio frequency signal, and process the radio frequency signal. A combination of the control circuit and the antenna may also be referred to as a transceiver, mainly configured to send/receive a radio frequency signal in an electromagnetic wave form. The control circuit may include the radio-frequency chip 2011 provided in this application. The input/output apparatus, such as a touchscreen, a display screen, or a keyboard, is mainly configured to receive data input by a user and output data to the user.

After the terminal device is powered on, the processor 2102 may read the software program in a storage unit, interpret and execute instructions of the software program, and process the data of the software program. When data needs to be wirelessly sent, after performing baseband processing on the to-be-sent data, the processor 2102 outputs a baseband signal to a radio frequency circuit. After performing radio frequency processing on the baseband signal, the radio frequency circuit sends a radio frequency signal in the electromagnetic wave form through the antenna. When data is sent to the terminal device, the radio frequency circuit receives a radio frequency signal through the antenna, converts the radio frequency signal into a baseband signal, and outputs the baseband signal to the processor 2102. The processor 2102 converts the baseband signal into data, and processes the data.

A person skilled in the art may understand that, for ease of description, FIG. 21 shows only one memory and one processor. In an actual terminal device, there may be a plurality of processors and a plurality of memories. The memory may also be referred to as a storage medium, a storage device, or the like. The memory may be a storage element located on a same radio-frequency chip as the processor, that is, an on-chip storage element, or an independent storage element. This is not limited in this embodiment of this application.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A radio-frequency chip, comprising:
a phased array, wherein the phased array comprises a plurality of branches, wherein each branch of the plurality of branches comprises a transmitting path, a receiving path, a common path, and a phase shifter, and wherein the phase shifter comprises a first phase shift unit located on the transmitting path, a second phase shift unit located on the receiving path, a third phase shift unit located on the common path, and a control interface, wherein the control interface is configured to provide a phase shift control signal and a turn-off control signal for the first phase shift unit and the second phase shift unit; and wherein the first phase shift unit is configured to provide, based on the phase shift control signal, a phase shift operation for a signal transmitted on the transmitting path;

wherein the first phase shift unit is configured to provide, based on the turn-off control signal, a turn-off operation for a signal transmitted on the transmitting path;

wherein the second phase shift unit is configured to provide, based on the phase shift control signal, a phase shift operation for a signal transmitted on the receiving path; and wherein the second phase shift unit is configured to provide, based on the turn-off control signal, a turn-off operation for a signal transmitted on the receiving path.

2. The radio-frequency chip according to claim 1, wherein a phase shift resolution of the first phase shift unit is the same as a phase shift resolution of the second phase shift unit, and wherein the phase shift resolution of the first phase shift unit is different from a phase shift resolution of the third phase shift unit.

3. The radio-frequency chip according to claim 1, wherein the phase shifter is a digital phase shifter, wherein the phase shift control signal comprises a plurality of digital control bits, and wherein a digital control bit corresponding to the first phase shift unit is higher than a digital control bit corresponding to the third phase shift unit.

4. The radio-frequency chip according to claim 1, wherein the first phase shift unit, the second phase shift unit, and the third phase shift unit are jointly connected to a same node; and at least one of:
the transmitted signals phase-shifted by the first phase shift unit enter the third phase shift unit through the same node based on the branch of the phased array configured to transmit signals; or
received signals phase-shifted by the third phase shift unit enter the second phase shift unit through the same node based on the branch of the phased array being configured to receive signals.

5. The radio-frequency chip according to claim 4, wherein the first phase shift unit has a differential signal structure, the first phase shift unit comprises a differential input end and a differential output end, the differential input end comprises a first input end and a second input end, and the differential output end comprises a first output end and a second output end;

wherein a first switch is coupled between the first input end and the first output end, a second switch is coupled between the second input end and the second output end, a third switch is coupled between the first input end and the second output end, and a fourth switch is coupled between the second input end and the first output end; and wherein the phase shift control signal is configured to provide mutually inverting control signals for a first group of switches and a second group of switches, wherein the turn-off control signal is configured to provide mutually non-inverting control signals for the first group of switches and the second group of switches, and wherein the first group of switches comprises the first switch and the second switch, and the second group of switches comprises the third switch and the fourth switch.

6. The radio-frequency chip according to claim 1, wherein the first phase shift unit comprises an input end and an output end, wherein a first switch and a second switch are coupled between the input end and the output end, wherein the phase shift control signal is configured to provide mutually inverting control signals for the first switch and the second switch, and wherein the turn-off control signal is configured to provide non-inverting control signals for the first switch and the second switch.

7. The radio-frequency chip according to claim 1, wherein a bulk of at least one switch of the first phase shift unit is coupled to a bias voltage module, the bias voltage module is configured to provide a bias voltage for the bulk of the switch, and the bias voltage is configured to increase an off-state impedance of the switch.

8. The radio-frequency chip according to claim 7, wherein the bias voltage of the bulk is adjustable.

9. The radio-frequency chip according to claim 8, wherein the bias voltage of the bulk is adjusted based on an on state and an off state of the switch.

10. The radio-frequency chip according to claim 7, wherein the bias voltage is further superposed on a gate of the switch when the switch is turned on.

11. The radio-frequency chip according to claim 7, wherein the bias voltage module is further configured to provide a bias voltage for a source and drain of the at least one switch.

12. A phase shift method, comprising:
performing:
- providing, by a first phase shift unit, based on a phase shift control signal for the first phase shift unit from a control interface, a phase shift for a signal transmitted on a transmitting path, wherein the first phase shift unit is comprised in a radio frequency chip, wherein the radio frequency chip comprises a phased array, the phased array comprises a plurality of branches, and each of the plurality of branches comprises a transmitting path, a receiving path, a common path, and a phase shifter, wherein the phase shifter comprises the first phase shift unit located on the transmitting path, a second phase shift unit located on the receiving path, a third phase shift unit located on the common path, and the control interface; and
- providing, by the second phase shift unit, based on a turn-off control signal for the second phase shift unit from the control interface, a turn-off operation for a signal transmitted on the receiving path; or performing:
- providing, by the first phase shift unit, based on a turn-off control signal for the first phase shift unit from the control interface, a turn-off operation for a signal transmitted on the transmitting path; and
- providing, by the second phase shift unit, based on a phase shift control signal for the second phase shift unit from the control interface, a phase shift for a signal transmitted on the receiving path.

13. The method according to claim 12, wherein a phase shift resolution of the first phase shift unit is the same as a phase shift resolution of the second phase shift unit, and wherein the phase shift resolution of the first phase shift unit is different from a phase shift resolution of the third phase shift unit.

14. The method according to claim 12, wherein the phase shifter is a digital phase shifter, wherein the phase shift control signal comprises a plurality of digital control bits, and wherein a digital control bit corresponding to the first phase shift unit is higher than a digital control bit corresponding to the third phase shift unit.

15. The method according to claim 12, wherein the first phase shift unit, the second phase shift unit, and the third phase shift unit are jointly connected to a same node; and wherein the method further comprises:
- triggering, based on controlling the branch of the phased array to transmit signals, the transmitted signals phase-shifted by the first phase shift unit to enter the third phase shift unit through the same node; or
- triggering, based on controlling the branch of the phased array to receive signals, the received signals phase-shifted by the third phase shift unit to enter the second phase shift unit through the same node.

16. The method according to claim 15, wherein the first phase shift unit has a differential signal structure, the first phase shift unit comprises a differential input end and a differential output end, the differential input end comprises a first input end and a second input end, and the differential output end comprises a first output end and a second output end;
wherein a first switch is coupled between the first input end and the first output end, a second switch is coupled between the second input end and the second output end, a third switch is coupled between the first input end and the second output end, and a fourth switch is coupled between the second input end and the first output end; and
wherein the phase shift control signal is configured to provide mutually inverting control signals for a first group of switches and a second group of switches, wherein the turn-off control signal is configured to provide mutually non-inverting control signals for the first group of switches and the second group of switches, and wherein the first group of switches comprises the first switch and the second switch, and the second group of switches comprises the third switch and the fourth switch.

17. The method according to claim 12, wherein the first phase shift unit comprises an input end and an output end, wherein a first switch and a second switch are coupled between the input end and the output end, wherein the phase shift control signal is configured to provide mutually inverting control signals for the first switch and the second switch, and wherein the turn-off control signal is configured to provide non-inverting control signals for the first switch and the second switch.

18. The method according to claim 12, wherein a bulk of at least one switch of the first phase shift unit is coupled to a bias voltage module, and wherein the method further comprises:
- controlling the bias voltage module to provide a bias voltage for the bulk of the switch, wherein the bias voltage is configured to increase an off-state impedance of the switch.

19. The method according to claim 18, further comprising:
- controlling the bias voltage module to provide a bias voltage for a source and drain of the at least one switch.

20. An electronic device, comprising:
at least one processor;
a memory; and
a transceiver, wherein the transceiver comprises a radio-frequency chip, comprising:
- a phased array, wherein the phased array comprises a plurality of branches, and each of the plurality of branches comprises a transmitting path, a receiving path, a common path, and a phase shifter, wherein the phase shifter comprises a first phase shift unit located on the transmitting path, a second phase shift unit located on the receiving path, a third phase shift unit located on the common path, and a control interface, and wherein the control interface is configured to provide a phase shift control signal and a turn-off control signal for the first phase shift unit and the second phase shift unit;
- wherein the first phase shift unit is configured to provide, based on the phase shift control signal, a phase shift operation for a signal transmitted on the transmitting path;
- wherein the first phase shift unit is configured to provide, based on the turn-off control signal, a turn-off operation for a signal transmitted on the transmitting path;
- wherein the second phase shift unit is configured to provide, based on the phase shift control signal, a phase shift operation for a signal transmitted on the receiving path; and
- wherein the second phase shift unit is configured to provide, based on the turn-off control signal, a turn-off operation for a signal transmitted on the receiving path.

* * * * *